United States Patent
Onishi et al.

(10) Patent No.: US 9,553,139 B2
(45) Date of Patent: Jan. 24, 2017

(54) SEMICONDUCTOR COMPONENT AND METHOD OF MANUFACTURE

(71) Applicant: Semiconductor Components Industries, LLC, Phoenix, AZ (US)

(72) Inventors: Akinobu Onishi, Ota (JP); Takashi Oomikawa, Fujioka (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/609,500

(22) Filed: Jan. 30, 2015

(65) Prior Publication Data

US 2016/0225843 A1 Aug. 4, 2016

(51) Int. Cl.

| H01L 21/70 | (2006.01) |
|---|---|
| H01L 29/00 | (2006.01) |
| H01L 21/20 | (2006.01) |
| H01L 49/02 | (2006.01) |
| H01L 27/06 | (2006.01) |
| H03F 3/45 | (2006.01) |

(52) U.S. Cl.
CPC ........... *H01L 28/20* (2013.01); *H01L 27/0629* (2013.01); *H03F 3/45475* (2013.01)

(58) Field of Classification Search
CPC ... H01L 28/20; H01L 27/0629; H01L 27/0802
USPC .......... 257/536–538, 380, E27.016, E27.047,257/E21.004; 438/382, 384
See application file for complete search history.

(56) References Cited

U.S. PATENT DOCUMENTS

| 6,369,654 | B1 | 4/2002 | Inagaki et al. | |
|---|---|---|---|---|
| 8,169,052 | B2 * | 5/2012 | Harada | ................. H01L 27/016 257/531 |
| 8,330,199 | B2 | 12/2012 | Kamakura et al. | |
| 8,604,589 | B2 * | 12/2013 | Tsukamoto et al. | .......... 257/538 |
| 2002/0047183 | A1 * | 4/2002 | Shiiki et al. | ................... 257/538 |
| 2004/0227237 | A1 * | 11/2004 | Ueda | ................... H01L 23/5228 257/734 |
| 2012/0280361 | A1 * | 11/2012 | Su et al. | ....................... 257/538 |
| 2014/0266409 | A1 * | 9/2014 | Lin | ........................... G05F 3/02 327/534 |

* cited by examiner

*Primary Examiner* — Fernando L Toledo
*Assistant Examiner* — Aaron Gray
(74) *Attorney, Agent, or Firm* — Rennie William Dover

(57) ABSTRACT

In accordance with an embodiment, a semiconductor component and a method for manufacturing a semiconductor component are provided. A first dielectric material is formed over a body of semiconductor material of the first conductivity type and a plurality of semiconductor fingers are formed over the first of dielectric material. Semiconductor fingers of the plurality of semiconductor fingers spaced apart from each other and at least one of the semiconductor fingers has a first end spaced apart from a second end by a central region. A second dielectric material is formed over central region of the at least one semiconductor finger of the plurality of semiconductor fingers. An electrically conductive material is formed over the second dielectric material that is over the central region of the at least one semiconductor finger. The electrically conductive material serves as a shielding structure and the semiconductor material may be coupled to a fixed potential.

18 Claims, 17 Drawing Sheets

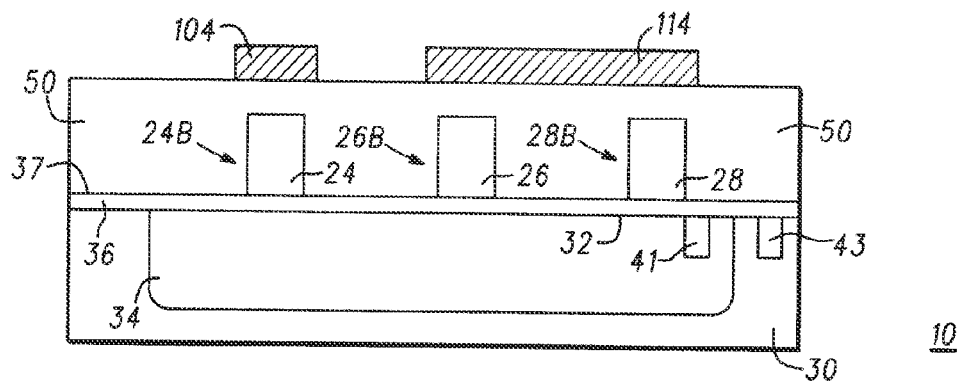
FIG. 31
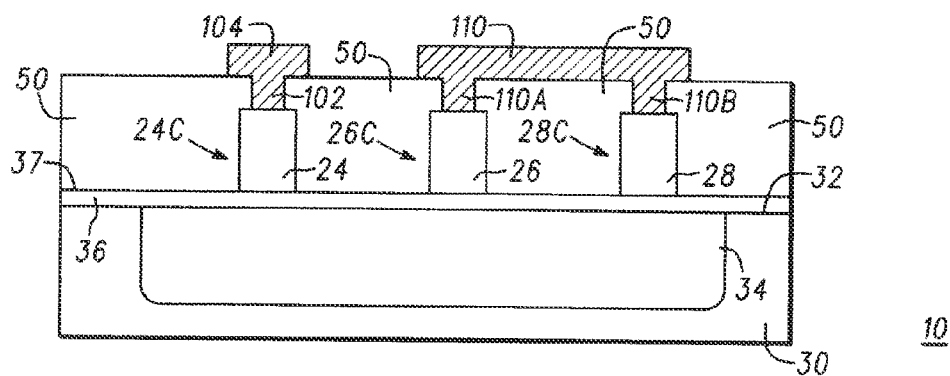
FIG. 32
FIG. 33
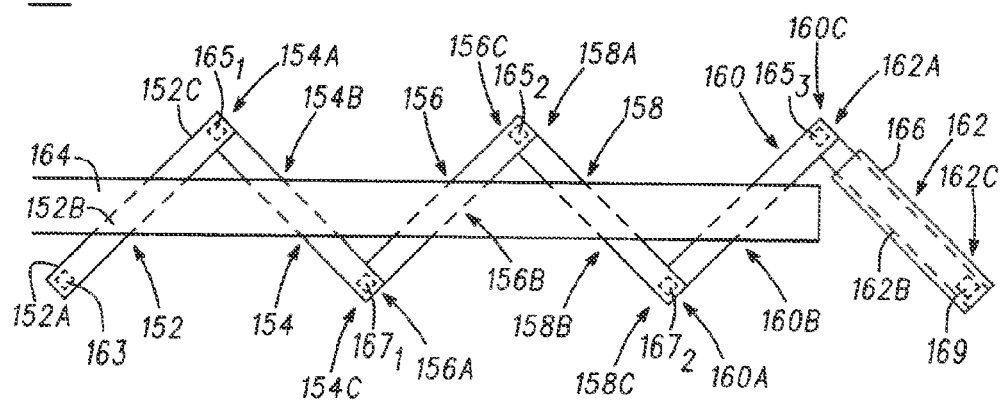

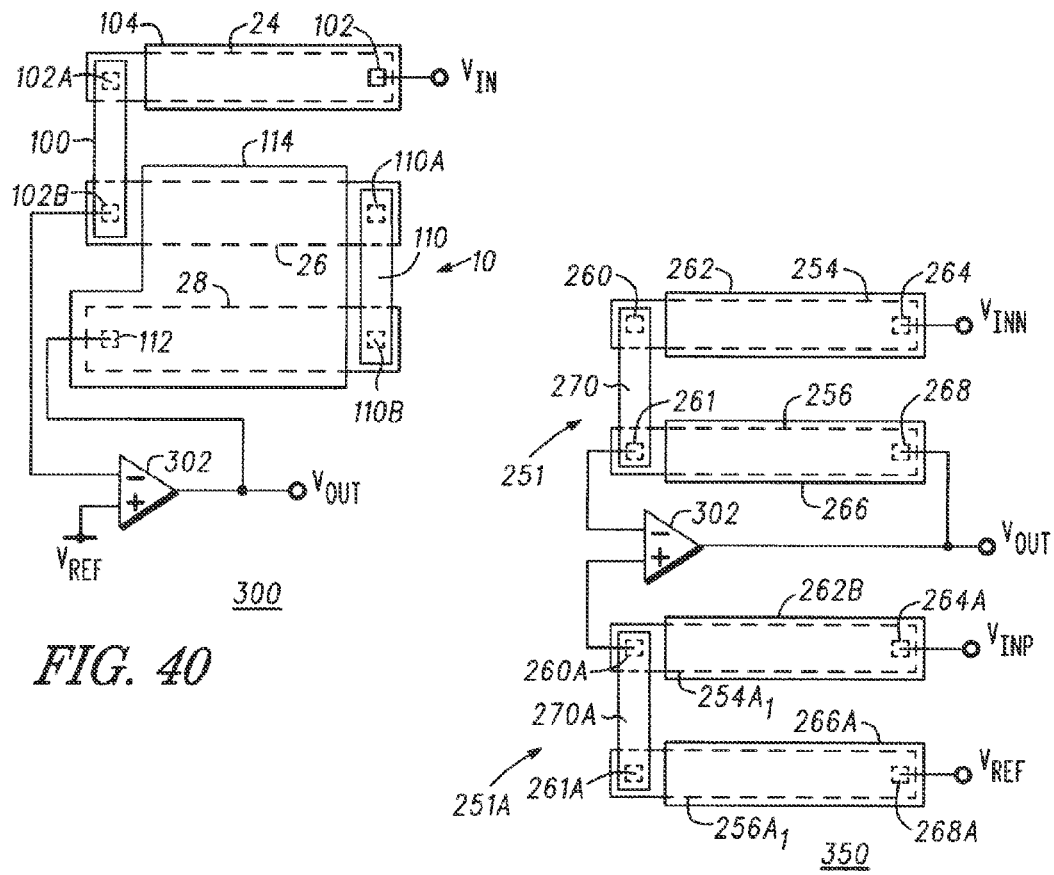
FIG. 40
FIG. 41
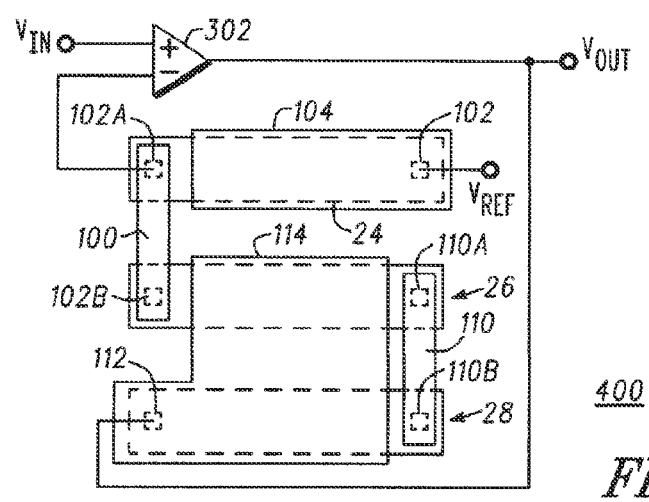
FIG. 42

US 9,553,139 B2

SEMICONDUCTOR COMPONENT AND METHOD OF MANUFACTURE

BACKGROUND

The present invention relates, in general, to electronics and, more particularly, to methods of forming semiconductor devices and structure.

In the past, semiconductor manufacturers have manufactured active components such as, for example, analog circuits, digital circuits and passive components such as, for example, resistors, capacitors, and inductors, from or in semiconductor materials. Typically, semiconductor component manufacturers use monolithic integration processes to manufacture, from a single semiconductor substrate, active circuits such as analog circuits or digital circuits with passive components. For example, resistors can be manufactured with active circuits to provide biasing for the active circuit or to develop voltages used by the active circuits. Analog active circuits such as, for example, an operational amplifier may include polysilicon resistors as feedback elements for gain control. A drawback with using polysilicon resistors is that their resistance values change, which degrades the performance of the analog active circuit.

Accordingly, it would be advantageous to have a polysilicon resistor and a method to manufacture the polysilicon resistor that does not degrade the performance of the active devices or the passive devices. It is desirable for the circuit and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 31 is a cross-sectional view of the semiconductor component of FIG. 20 taken along the region identified by section line 25-25 of FIG. 20 but at a later stage of manufacture;

FIG. 32 is a cross-sectional view of the semiconductor component of FIG. 20 taken along the region identified by section line 26-26 of FIG. 20 but at a later stage of manufacture;

FIG. 33 is a top view of a semiconductor component in accordance with an embodiment of the present invention;

FIG. 40 is a circuit diagram of an amplifier circuit in a negative feedback configuration in accordance with another embodiment of the present invention;

FIG. 41 is a circuit diagram of an amplifier circuit in a negative feedback configuration in accordance with another embodiment of the present invention;

FIG. 42 is a circuit diagram of an amplifier circuit in a negative feedback configuration in accordance with another embodiment of the present invention;

Figure 1:
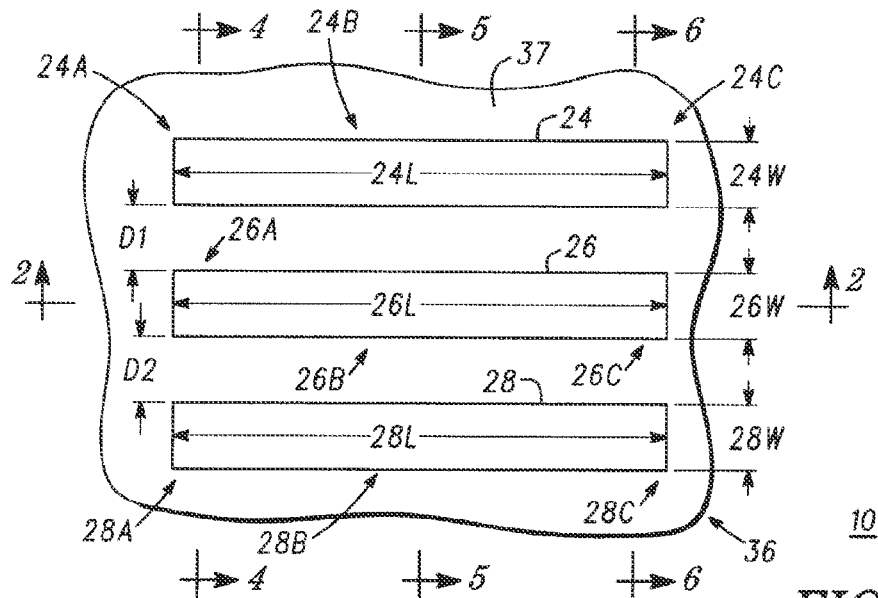
FIG. 1 is a top view of a semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally, the present invention provides a polysilicon resistor and method for manufacturing the polysilicon resistor. The polysilicon resistor is manufactured over a semiconductor material that is electrically connected or tied to a fixed potential. Electrically connecting the semiconductor material to the fixed potential mitigates the influence of the semiconductor material on the resistance value of the polysilicon resistor thereby decoupling the influence of the electrical potential of the semiconductor material on the resistance value of the polysilicon resistor. Connecting the semiconductor material to the fixed potential improves the linearity of the polysilicon resistor which improves the distortion characteristics of circuits that include a polysilicon resistor. In addition, an electrically conductive layer is formed over portions of the polysilicon resistor to cancel out polysilicon resistance value changes arising from changes in the electric potential of the semiconductor material.

In accordance with another embodiment a method for manufacturing a semiconductor component is provided that includes providing a body of semiconductor material of a first conductivity type. A first dielectric material is formed over the body of semiconductor material of the first conductivity type and a plurality of semiconductor fingers are formed over the first of dielectric material. The semiconductor fingers are spaced apart from each other, wherein at least one of the semiconductor fingers has a first end spaced apart from a second end by a central region. A second dielectric material is formed over the central region of the at least one semiconductor finger and an electrically conductive material over the second dielectric material that is over the central region of the at least one semiconductor finger.

In accordance with another embodiment, a semiconductor component, comprises a resistor network connected to an active device. The resistor network is comprised of a first polysilicon resistor having a first region, a second region, and a third region, the second region between the first region and the third region, wherein a least a portion of the second region of the first polysilicon resistor is between a first layer of dielectric material and a second layer of dielectric material, and wherein a first electrically conductive material is formed over the second layer of dielectric material and contacts the first region of the first polysilicon resistor, and a second electrically conductive material contacts the third region of the first polysilicon resistor.

Figure 2:
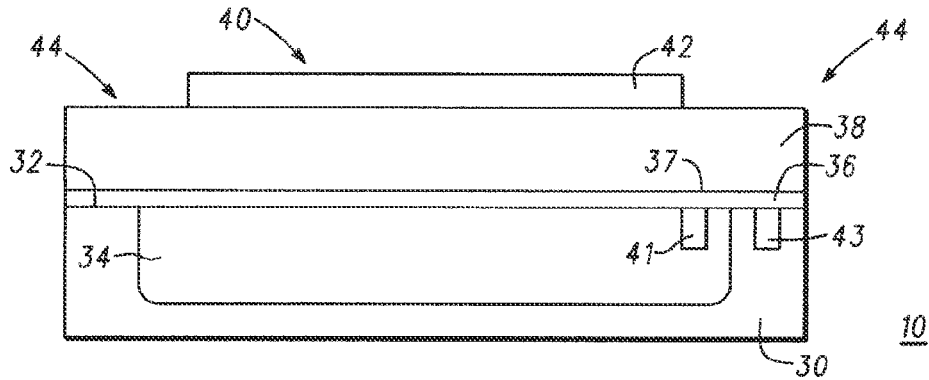
FIG. 2 is a cross-sectional view of the semiconductor component of FIG. 1 taken along the region identified by section line 2-2 of FIG. 1 but at an earlier stage of manufacture.

FIG. 1 is a top view of a semiconductor component 10 in accordance with an embodiment of the present invention. By way of example, semiconductor component 10 is a polysilicon resistor. What is shown in FIG. 1 is a dielectric material 36 having a surface 37 formed on or over a semiconductor material 12 that is shown in FIG. 2. A plurality of resistive elements 24, 26, and 28 are formed on dielectric material 20. Resistive element 24 has ends 24A and 24C separated by a central portion 24B. Likewise, resistive element 26 has ends 26A and 26C separated by a central portion 26B and resistive element 28 has ends 28A and 28C separated by a central portion 28C. It should be noted that a resistive element may be referred to as a resistor finger, a resistor layer, a resistor stripe, or the like, and a central portion may be referred to as a central region or a central area. In FIG. 1 resistive elements are shown as being rectangular segments having the same lengths and widths and being substantially parallel to each other. However, resistor elements 24, 26, and 28 are not limited to a rectangular configuration or these dimensions. The lengths of resistor elements 24, 26, and 28 are identified by reference characters 24L, 26L, and 28L, respectively, and the widths of resistor elements 24, 26, and 28 are identified by reference characters 24W, 26W, and 28W, respectively. In the embodiment shown in FIG. 1, resistor elements 24 and 26 are laterally spaced apart by a distance D1 and resistor elements 26 and 28 are laterally spaced apart by a distance D2.

FIG. 2 is a cross-sectional view of semiconductor component 10 taken along the region identified by section line 2-2 of FIG. 1 but at an earlier stage of manufacture. What is shown in FIG. 2 is a body of semiconductor material 30 having a surface 32. In accordance with an embodiment, body of semiconductor material 30 is silicon of a first conductivity type having a well 34 of a second conductivity type extending from surface 32 into a portion of body of semiconductor material 30. By way of example, the first conductivity type is p-type conductivity and the second conductivity type is n-type conductivity. By way of example, body of semiconductor material 30 has a dopant concentration ranging from about $1\times10^{19}$ atoms per centimeter cubed (atoms/cm$^3$) to about $5\times10^{19}$ atoms/cm$^3$. The dopant concentration of body of semiconductor material 30 is not a limitation of the present invention. Alternatively, the first conductivity type may be n-type conductivity and the second conductivity type may be p-type conductivity. It should be noted that a region or layer doped with an n-type dopant is said to be of an n-type conductivity or an n conductivity type and a region or layer doped with a p-type dopant is said to be of a p-type conductivity or a p conductivity type. Impurity materials or dopants of p-type conductivity include boron and indium, and impurity materials or dopants of n-type conductivity include phosphorus or arsenic. Semiconductor material 30 is not limited to being silicon but may be germanium, gallium arsenide, indium phosphide, a silicon on insulator substrate, or the like. In addition, body of semiconductor material 30 may be a substrate or it may be a substrate on which on epitaxial layer is grown.

A heavily doped region 41 is formed in well 34, wherein doped region 41 extends from surface 32 into well 34. A heavily doped region 43 is formed in semiconductor material 30, wherein doped region 43 extends from surface 32 into semiconductor material 30. In accordance with an embodiment, heavily doped region 41 has the same conductivity type as well region 34 and doped region 43 has the same conductivity type as semiconductor material 30. For example, well 34 and heavily doped region 41 are n-type conductivity and semiconductor material 30 and heavily doped region 43 are p-type conductivity. Doped regions 41 and 43 may be formed by ion implantation. It should be noted that in the completed semiconductor structure, doped region 41 is electrically coupled to a first fixed potential and doped region 43 is electrically coupled to a second fixed potential that is different from the first fixed potential. By way of example, the first fixed potential may be $V_{DD}$ or the most positive voltage in the circuit and the second fixed potential may be $V_{SS}$ or ground.

A layer of dielectric material 36 is formed on or from body of semiconductor material 30. In accordance with an embodiment of the present invention, the material of dielectric layer 36 is silicon dioxide having a thickness ranging from about 200 Angstroms (Å) to about 1,000 Å. Techniques for forming silicon dioxide layer 36 are known to those skilled in the art.

A layer of polysilicon 38 having a thickness ranging, for example, from about 0.1 μm to about 0.4 μm is formed on dielectric layer 36. In accordance with an embodiment, polysilicon layer 38 is doped with an impurity material of n-type conductivity. By way of example, the polysilicon resistors may have a sheet resistance ranging from about 1 ohm-centimeter to about 50 kilo-ohm centimeters. The sheet resistance of the polysilicon resistors is not a limitation of the present invention. Alternatively, polysilicon layer 38 may be doped with an impurity material of p-type conductivity. The impurity material may also be referred to as a dopant.

Still referring to FIG. 2, a layer of photoresist is formed on polysilicon layer 38 and patterned to form a masking structure 40 having masking elements 42 and openings 44 that expose portions of polysilicon layer 38. Masking structure 34 is also referred to as a mask or an etch mask.

Figure 3:
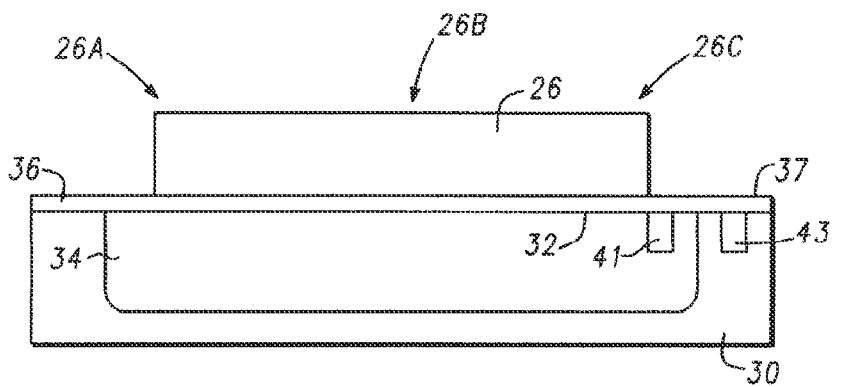
FIG. 3 is a cross-sectional view of the semiconductor component of FIG. 2 at a later stage of manufacture.

Referring now to FIG. 3, the portions of polysilicon layer 38 that are unprotected by masking structure 40 are removed using, for example, a reactive ion etch, to form resistor element 26 having ends 26A and 26C, and a central region 26B. Although a single resistor element is shown in FIG. 3, it should be noted that resistor elements 24 and 28 may be formed using a similar manner as described for the formation of resistor element 26. Although only three resistor elements 24, 26, and 28 are shown in FIG. 1, this is not a limitation of the present invention. There may be fewer than or more than three resistor elements. In addition the configuration of the resistor elements is not limited to being rectangular structures that are substantially parallel to each other.

Figure 4:
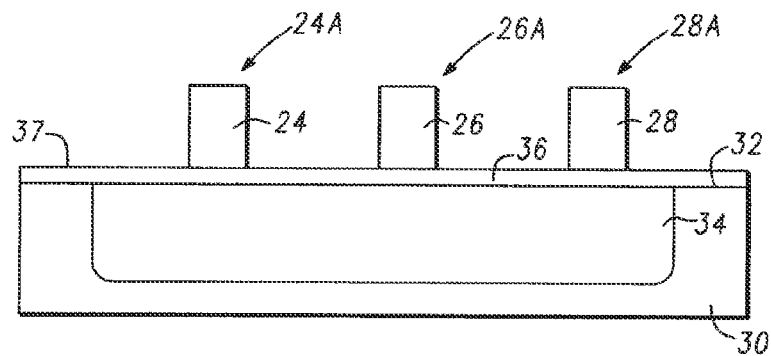
FIG. 4 is a cross-sectional view of the semiconductor component of FIG. 1 taken along the region identified by section line 4-4 of FIG. 1.

FIG. 4 is a cross-sectional view of resistor elements 24, 26, and 28 taken along section line 4-4 of FIG. 1. What is shown in FIG. 4 are ends 24A, 26A, and 28A of resistor elements 24, 26, and 28, respectively, formed on dielectric layer 26 and over well region 34 after the etching step described with reference to FIG. 3.

Figure 5:
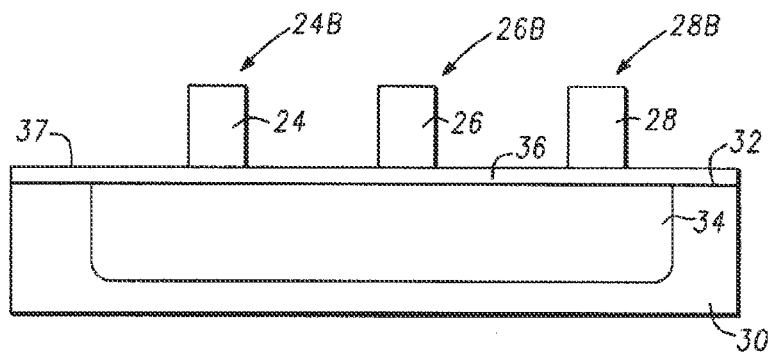
FIG. 5 is a cross-sectional view of the semiconductor component of FIG. 1 taken along the region identified by section line 5-5 of FIG. 1.

FIG. 5 is a cross-sectional view of resistor elements 24, 26, and 28 taken along section line 5-5 of FIG. 1. What is shown in FIG. 5 are ends 24B, 26B, and 28B of resistor elements 24, 26, and 28, respectively, formed on dielectric layer 26 and over well region 34 after the etching step described with reference to FIG. 3.

Figure 6:
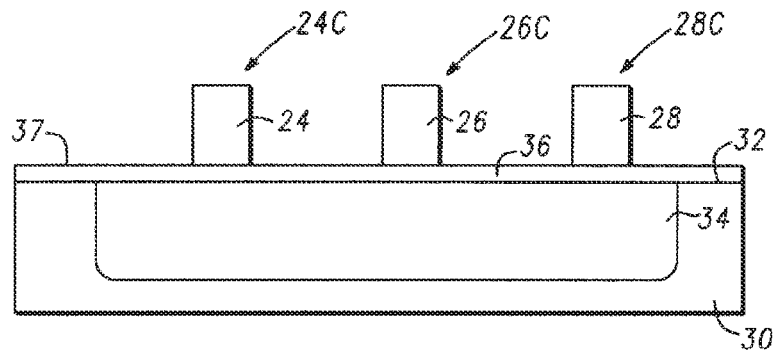
FIG. 6 is a cross-sectional view of the semiconductor component of FIG. 1 taken along the region identified by section line 6-6 of FIG. 1.

FIG. 6 is a cross-sectional view of resistor elements 24, 26, and 28 taken along section line 6-6 of FIG. 1. What is shown in FIG. 6 are ends 24C, 26C, and 28C of resistor elements 24, 26, and 28, respectively, formed on dielectric layer 26 and over well region 34 after the etching step described with reference to FIG. 3.

Figure 7:
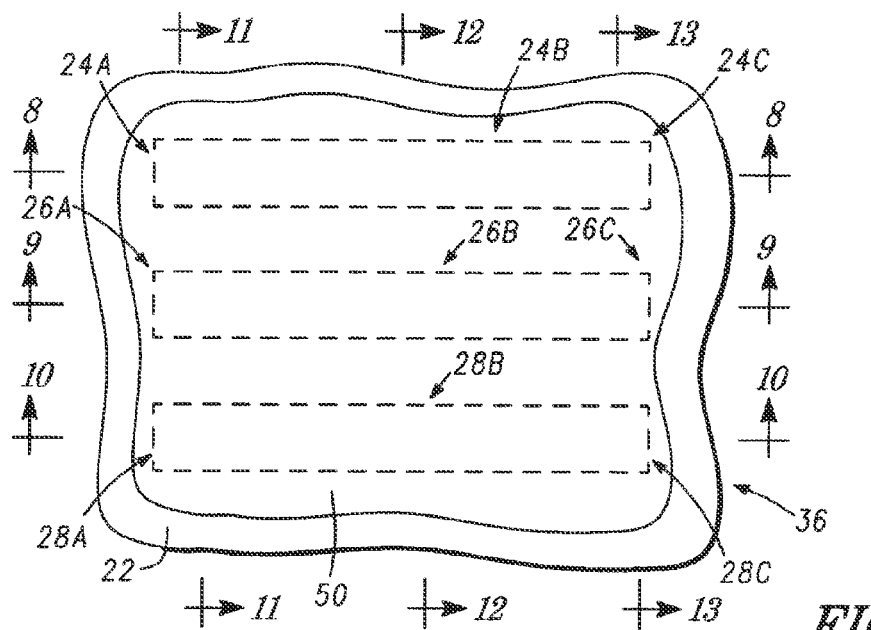
FIG. 7 is a top view of the semiconductor component of FIGS. 3-5 at a later stage of manufacture.

FIG. 7 is a top view of semiconductor component 10 further along in manufacture. More particularly, a layer of dielectric material 50 having a thickness ranging from, for example about 0.25 µm to about 1 µm is formed on resistor elements 24, 26, and 28 and on the exposed portions of dielectric layer 36, i.e., the portions of dielectric layer 36 unprotected by resistor elements 24, 26, and 28. Suitable materials for dielectric layer 50 include silicon dioxide, silicon nitride, oxide formed by deposition of tetraethylorthosilicate, i.e., a TEOS layer, or the like. It should be noted that resistor elements 24, 26, and 28 are illustrated by broken lines because they are covered by dielectric layer 50. It should be further noted that dielectric layer 50 is illustrated as a "wavy" enclosure because it only represents a portion of dielectric layer 50 and to illustrate portions of dielectric layer 36, which dielectric layer 36 is illustrated as a wavy enclosure because it only represents a portion of dielectric layer 36.

Figure 8:
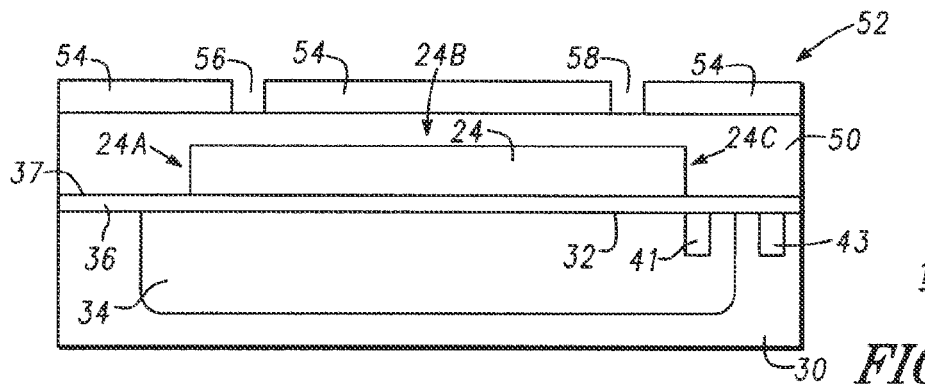
FIG. 8 is a cross-sectional view of the semiconductor component of FIG. 7 taken along the region identified by section line 8-8 of FIG. 7 but at a later stage of manufacture.

FIG. 8 is a cross-sectional view of resistor element 24 taken in the region of section line 8-8 of FIG. 7, but at a later stage of manufacture from that shown in FIG. 7. What is shown in FIG. 8 is layer of dielectric material 50 formed on resistor element 24 and on the exposed portions of dielectric layer 36 as described with reference to FIG. 7. A layer of photoresist is formed over dielectric layer 50 and patterned to form a masking structure 52 having masking elements 54 and openings 56 and 58 that expose portions of dielectric layer 50. It should be noted that patterning the layer of photoresist also forms openings 60 and 62, which are described with reference to FIG. 9 and openings 64 and 66, which are described with reference to FIG. 10. Masking structure 52 is also referred to as a mask or an etch mask. Openings 56 and 58 expose portions of dielectric layer 50 over ends 24A and 24C of resistor element 24, respectively.

Figure 9:
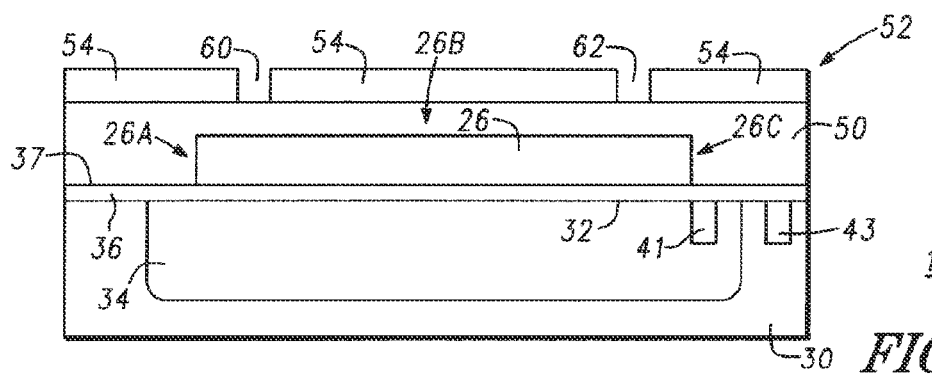
FIG. 9 is a cross-sectional view of the semiconductor component of FIG. 7 taken along the region identified by section line 9-9 of FIG. 7 but at a later stage of manufacture.

FIG. 9 is a cross-sectional view of resistor element 26 taken along the region of section line 9-9 of FIG. 7, but at a later stage of manufacture from that shown in FIG. 7. What is shown in FIG. 9 is layer of dielectric material 50 formed on resistor element 26 and on the exposed portions of dielectric layer 36 as described with reference to FIG. 7. FIG. 9 also shows the patterned layer of photoresist that forms masking structure 52 having masking elements 54 and openings 60 and 62, wherein openings 60 and 62 expose portions of dielectric layer 50 over ends 26A and 26C of resistor element 26, respectively.

Figure 10:
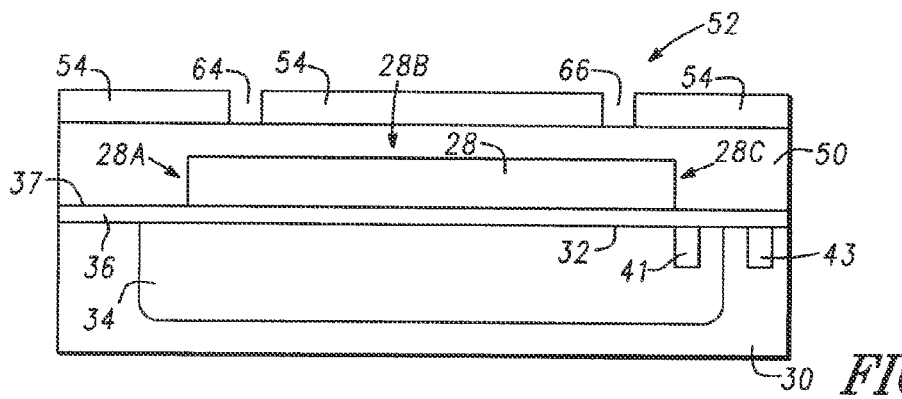
FIG. 10 is a cross-sectional view of the semiconductor component of FIG. 7 taken along the region identified by section line 10-10 of FIG. 7 but at a later stage of manufacture.

FIG. 10 is a cross-sectional view of resistor element 28 taken along the region of section line 10-10 of FIG. 7, but at a later stage of manufacture from that shown in FIG. 7. What is shown in FIG. 10 is layer of dielectric material 50 formed on resistor element 28 and on the exposed portions of dielectric layer 36 as described with reference to FIG. 7. FIG. 10 also shows the patterned layer of photoresist that forms masking structure 52 having masking elements 54 and openings 64 and 66, wherein openings 64 and 66 expose portions of dielectric layer 50 over ends 28A and 28C of resistor element 28, respectively.

Figure 11:
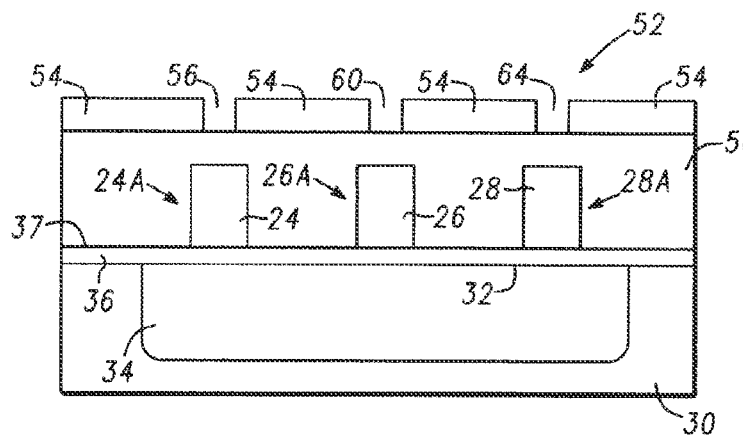
FIG. 11 is a cross-sectional view of the semiconductor component of FIG. 7 taken along the region identified by section line 11-11 of FIG. 7 but at a later stage of manufacture.

FIG. 11 is a cross-sectional view of resistor elements 24, 26, and 28 taken along the region of section line 11-11 of FIG. 7, but at a later stage of manufacture from that shown in FIG. 7. What is shown in FIG. 11 is layer of dielectric material 50 formed on resistor elements 24, 26, and 28 and on the exposed portions of dielectric layer 36 as described with reference to FIG. 7. FIG. 11 also shows the patterned layer of photoresist that forms masking structure 52 having masking elements 54 and openings 56, 58, and 60, wherein openings 56, 58, and 60 expose portions of dielectric layer 50 over ends 24A, 26A, and 28A of resistor elements 24, 26, and 28, respectively.

Figure 12:
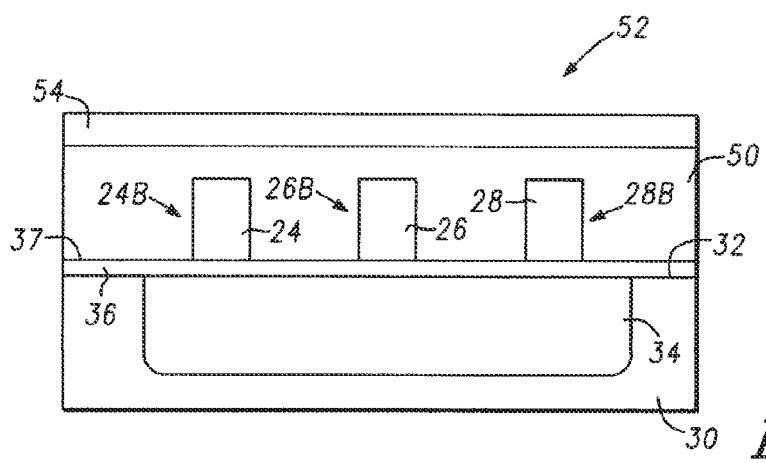
FIG. 12 is a cross-sectional view of the semiconductor component of FIG. 7 taken along the region identified by section line 12-12 of FIG. 7 but at a later stage of manufacture.

FIG. 12 is a cross-sectional view of resistor elements 24, 26, and 28 taken along the region of section line 12-12 of FIG. 7, but at a later stage of manufacture from that shown in FIG. 7. What is shown in FIG. 12 is layer of dielectric material 50 formed on resistor elements 24, 26, and 28 and on the exposed portions of dielectric layer 36 as described with reference to FIG. 7. FIG. 12 also shows the patterned layer of photoresist that forms masking structure 52 having a masking element 54. It should be noted that in accordance with this embodiment openings are absent in the photoresist layer over regions 24B, 26B, and 28B of resistor elements 24, 26, and 28, respectively.

Figure 13:
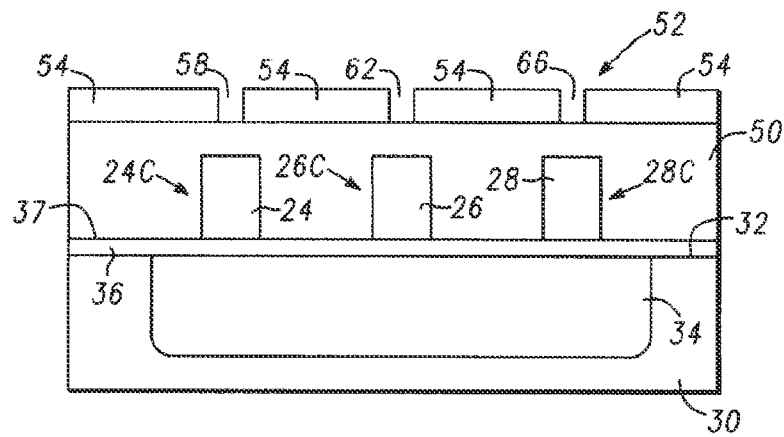
FIG. 13 is a cross-sectional view of the semiconductor component of FIG. 7 taken along the region identified by section line 13-13 of FIG. 7 but at a later stage of manufacture.

FIG. 13 is a cross-sectional view of resistor elements 24, 26, and 28 taken along the region of section line 13-13 of FIG. 7, but at a later stage of manufacture from that shown in FIG. 7. What is shown in FIG. 13 is layer of dielectric material 50 formed on resistor elements 24, 26, and 28 and on the exposed portions of dielectric layer 36 as described with reference to FIG. 7. FIG. 13 also shows the patterned layer of photoresist that forms masking structure 52 having masking elements 54 and openings 64, wherein openings 64 expose portions of dielectric layer 50 over ends 24C, 26C, and 28C of resistor elements 24, 26, and 28, respectively.

Figure 14:
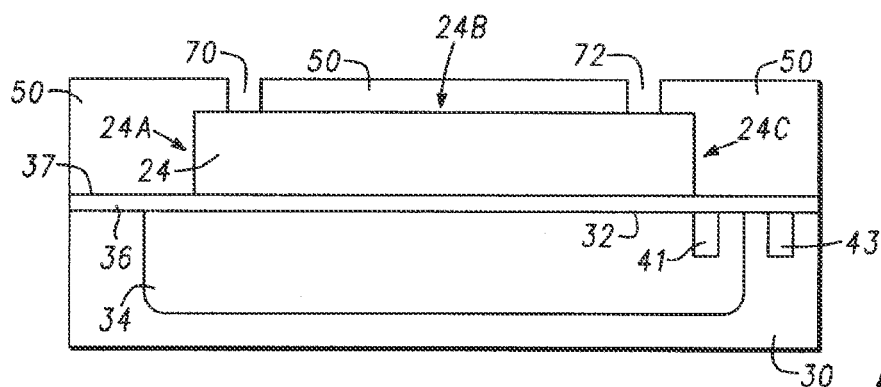
FIG. 14 is a cross-sectional view of the semiconductor component of FIG. 8 taken along the region identified by section line 8-8 of FIG. 7 but at a later stage of manufacture.

Referring now to FIGS. 14-19, the portions of dielectric layer 50 that are unprotected by masking elements 54 are removed using, for example, a reactive ion etch, to form contact openings through dielectric layer 50 that expose portions of resistor elements 24, 26, and 28. After formation of the contact openings, masking elements 54 are removed. More particularly, FIG. 14 is a cross-sectional view taken along section line 8-8 of FIG. 7 but at a later stage of manufacture and illustrates the formation of contact openings 70 and 72 that expose portions of ends 24A and 24C, respectively, of resistor element 24.

Figure 15:
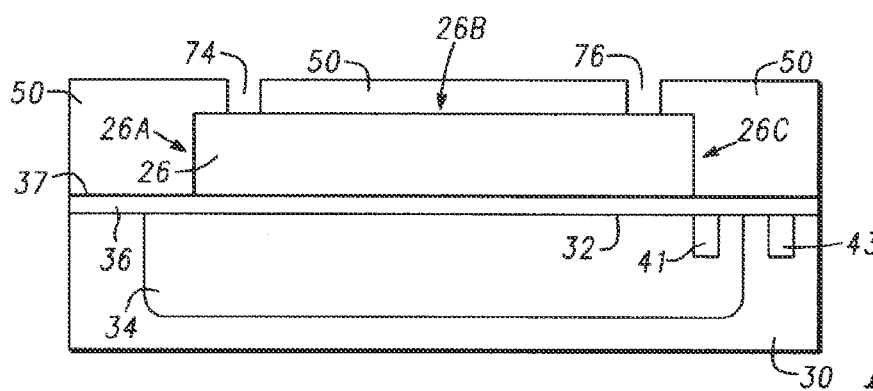
FIG. 15 is a cross-sectional view of the semiconductor component of FIG. 9 taken along the region identified by section line 9-9 of FIG. 7 but at a later stage of manufacture.

FIG. 15 is a cross-sectional view taken along section line 9-9 of FIG. 7 but at a later stage of manufacture and illustrates the formation of contact openings 74 and 76 that expose portions of ends 26A and 26C, respectively, of resistor element 26.

Figure 16:
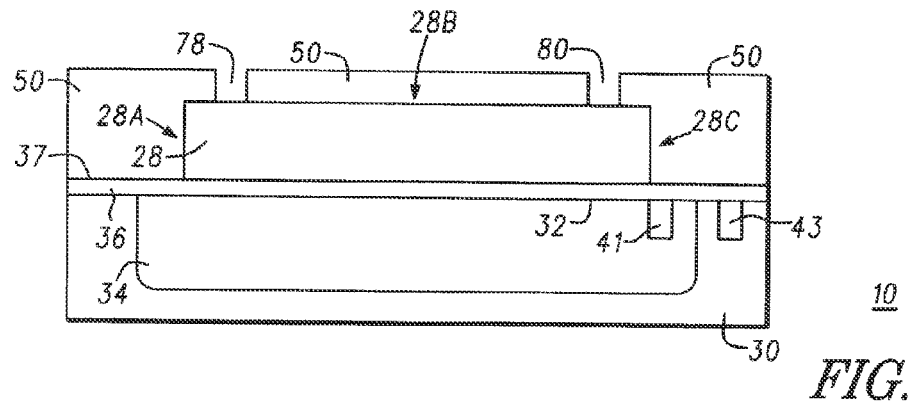
FIG. 16 is a cross-sectional view of the semiconductor component of FIG. 10 taken along the region identified by section line 10-10 of FIG. 7 but at a later stage of manufacture.

FIG. 16 is a cross-sectional view taken along section line 10-10 of FIG. 7 but at a later stage of manufacture and illustrates the formation of contact openings 78 and 80 that expose portions of ends 28A and 28C, respectively, of resistor element 28.

Figure 17:
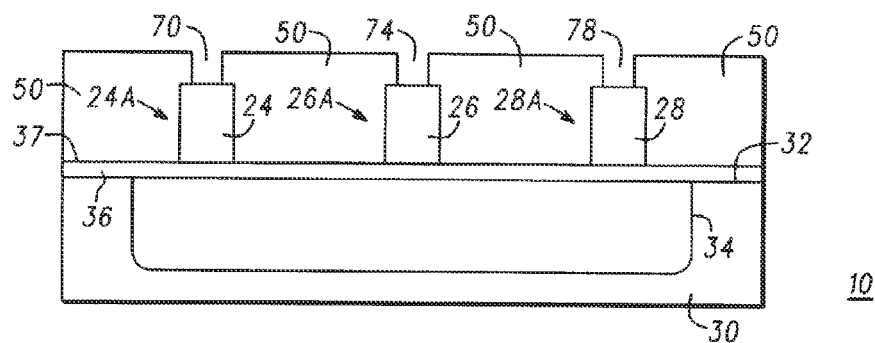
FIG. 17 is a cross-sectional view of the semiconductor component of FIG. 11 taken along the region identified by section line 11-11 of FIG. 7 but at a later stage of manufacture.

FIG. 17 is a cross-sectional view taken along section line 11-11 of FIG. 7 but at a later stage of manufacture and illustrates the formation of contact openings 70, 74, and 78 that expose portions of ends 24A, 26A, and 28A of resistor elements 24, 26, and 28, respectively.

Figure 18:
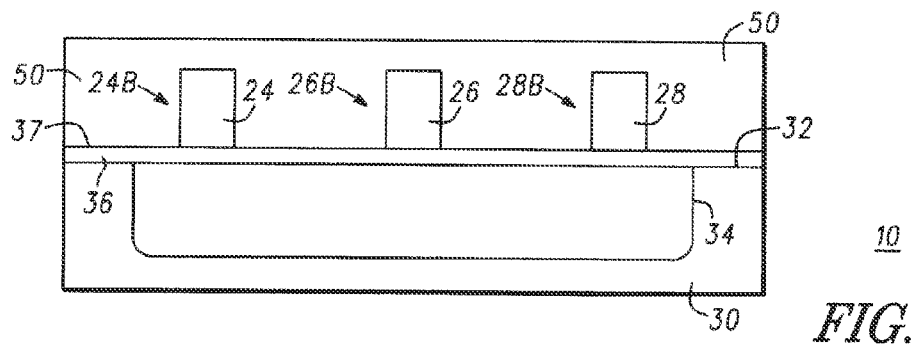
FIG. 18 is a cross-sectional view of the semiconductor component of FIG. 12 taken along the region identified by section line 12-12 of FIG. 7 but at a later stage of manufacture.

FIG. 18 is a cross-sectional view taken along section line 12-12 of FIG. 7 but at a later stage of manufacture and illustrates that in accordance with this embodiment contact openings are not formed in central regions 24B, 26B, and 28B of resistor elements 24, 26, and 28, respectively.

Figure 19:
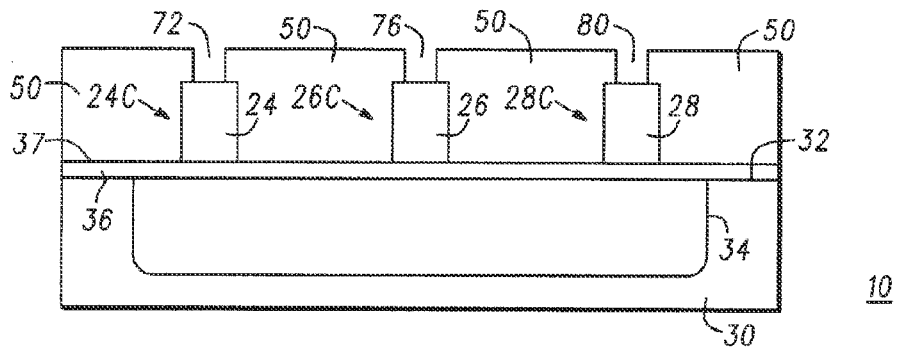
FIG. 19 is a cross-sectional view of the semiconductor component of FIG. 13 taken along the region identified by section line 13-13 of FIG. 7 but at a later stage of manufacture.

FIG. 19 is a cross-sectional view taken along section line 13-13 of FIG. 7 but at a later stage of manufacture and illustrates the formation of contact openings 72, 76, and 80 that expose portions of ends 24C, 26C, and 28C or resistor elements 24, 26, and 28, respectively.

Figure 20:
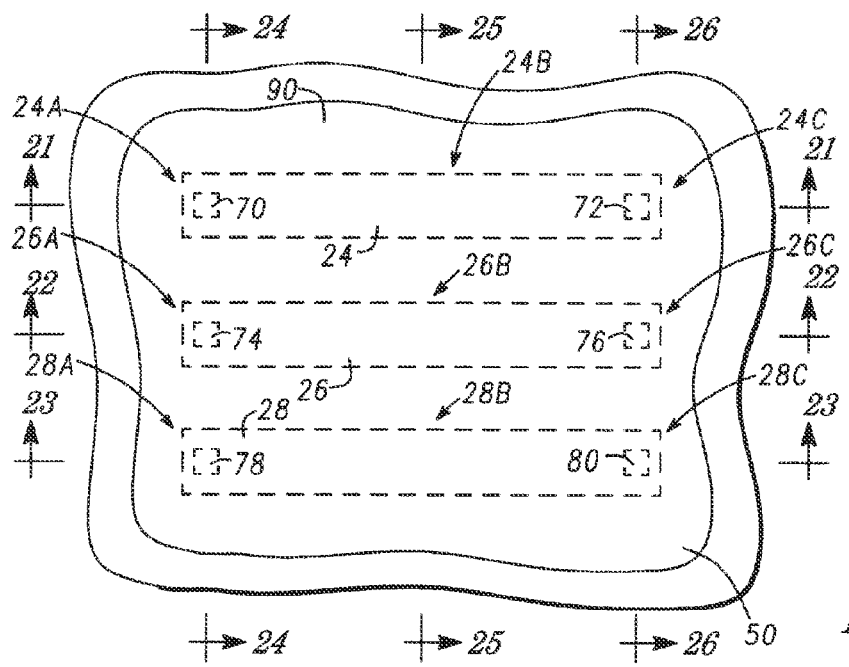
FIG. 20 is a top view of the semiconductor component of FIGS. 14-19 further along in manufacture.

FIG. 20 is a top view of semiconductor component 10 further along in manufacture. More particularly, a layer of electrically conductive material 90 having a thickness ranging from, for example, about 0.25 μm to about 1 μm is formed on dielectric layer 50 and on the portions of resistor element 24 exposed by openings 70 and 72, the exposed portions of resistor element 26 exposed by openings 74 and 76, and on the exposed portions of resistor element 28 exposed by openings 78 and 80. Suitable materials for electrically conductive layer 90 include copper, aluminum, or the like. It should be noted that resistor elements 24, 26, and 28 are illustrated by broken lines because they are covered by electrically conductive layer 90. In addition, openings 70, 72, 74, 76, 78, and 80 are illustrated by squares made up of broken lines. It should be noted that openings 70, 72, 74, 76, 78, and 80 are filled with the electrically conductive material of electrically conductive layer 90. It should be further noted that electrically conductive layer 90 is illustrated as a "wavy" enclosure because it only represents a portion of electrically conductive layer 90 and to illustrate portions of dielectric layer 50, which dielectric layer 50 is illustrated as a wavy enclosure because it only represents a portion of dielectric layer 50.

Figure 21:
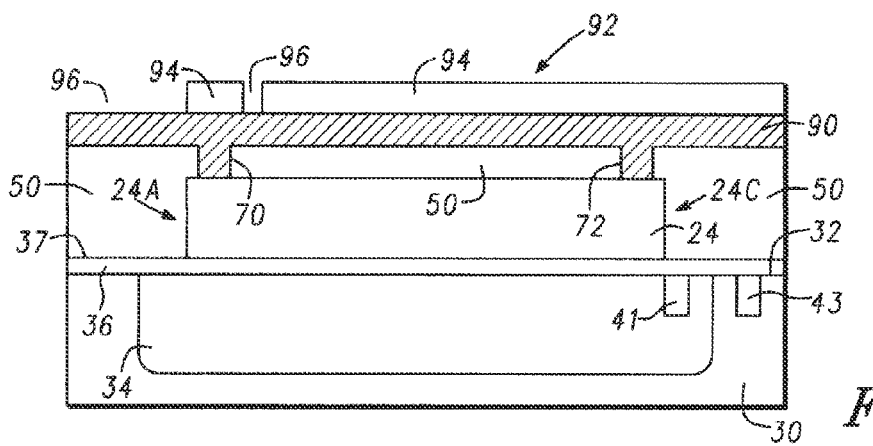
FIG. 21 is a cross-sectional view of the semiconductor component of FIG. 20 taken along the region identified by section line 21-21 of FIG. 20 but at a later stage of manufacture.

FIG. 21 is a cross-sectional view of resistor element 24 taken in the region of section line 21-21 of FIG. 20, but at a later stage of manufacture from that shown in FIG. 20. What is shown in FIG. 21 is electrically conductive layer 90 formed on dielectric layer 50 and on the portions of resistor element 24 exposed by openings 70 and 72, wherein the material of electrically conductive layer 90 fills openings 70 and 72. A layer of photoresist is formed on electrically conductive layer 90 and patterned to form a masking structure 92 having masking elements 94 and openings 96 that expose portions of electrically conductive layer 90. Masking elements 94 are also referred to as a mask or an etch mask. It should be noted that masking elements 94 remains over the portions of electrically conductive layer 90 that are over the body region 24B of resistor element 24, i.e., the electrically conductive material over the portion 24B of resistor element 24 between ends 24A and 24C. Although masking element 94 over the portion of electrically conductive material 90 in opening 70 is shown as extending beyond the sidewalls of opening 70, this is not a limitation of the present invention. For example, masking structure 94 may be in alignment with the sidewalls of opening 70.

Figure 22:
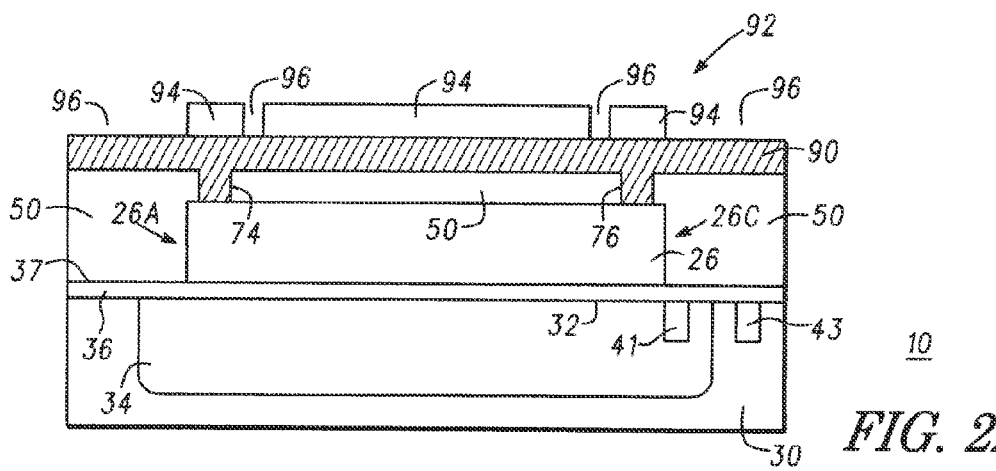
FIG. 22 is a cross-sectional view of the semiconductor component of FIG. 20 taken along the region identified by section line 22-22 of FIG. 20 but at a later stage of manufacture.

FIG. 22 is a cross-sectional view of resistor element 26 taken in the region of section line 22-22 of FIG. 20, but at a later stage of manufacture from that shown in FIG. 20. What is shown in FIG. 22 is electrically conductive layer 90 formed on dielectric layer 50 and on the portions of resistor element 26 exposed by openings 74 and 76, wherein the material of electrically conductive layer 90 fills openings 74 and 76. A masking element 94 remains over the portion of electrically conductive layer 90 that is over the body region 26B of resistor element 26, i.e., the electrically conductive material over the portion 26B of resistor element 26 between ends 26A and 26C. Although masking elements 94 over the portions of electrically conductive material 90 in openings 74 and 76 are shown as extending beyond the sidewalls of openings 74 and 76, this is not a limitation of the present invention. For example, masking structures 94 over openings 74 and 76 may be in alignment with the sidewalls of openings 74 and 76.

Figure 23:
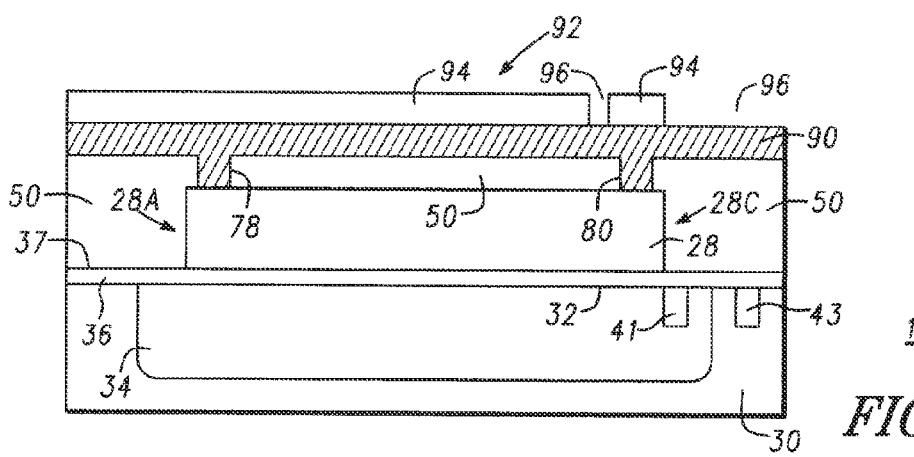
FIG. 23 is a cross-sectional view of the semiconductor component of FIG. 20 taken along the region identified by section line 23-23 of FIG. 20 but at a later stage of manufacture.

FIG. 23 is a cross-sectional view of resistor element 28 taken in the region of section line 23-23 of FIG. 20, but at a later stage of manufacture from that shown in FIG. 20. What is shown in FIG. 23 is electrically conductive layer 90 formed on dielectric layer 50 and on the portions of resistor element 28 exposed by openings 78 and 80, wherein the material of electrically conductive layer 90 fills openings 78 and 80. A masking element 94 remains over the portion of electrically conductive layer 90 that is over the body region 28B of resistor element 28, i.e., the electrically conductive material over the portion 28B of resistor element 28 between ends 28A and 28C. Although masking element 94 over the portion of electrically conductive material 90 in opening 80 is shown as extending beyond the sidewalls of opening 80, this is not a limitation of the present invention. For example, masking structure 94 may be in alignment with the sidewalls of opening 80.

Figure 24:
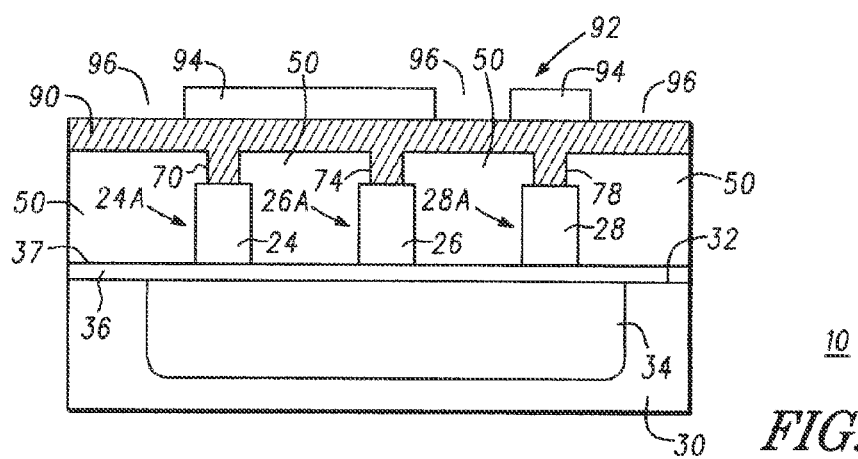
FIG. 24 is a cross-sectional view of the semiconductor component of FIG. 20 taken along the region identified by section line 24-24 of FIG. 20 but at a later stage of manufacture.

FIG. 24 is a cross-sectional view of resistor elements 24, 26, and 28 taken in the region of section line 24-24 of FIG. 20, but at a later stage of manufacture from that shown in FIG. 20. What is shown in FIG. 24 is electrically conductive layer 90 formed on dielectric layer 50 and on the portions of resistor elements 24, 26, and 28 exposed by openings 70, 74, and 78, respectively. As discussed above, the material of electrically conductive layer 90 fills openings 70, 74, and 78. Masking structures 94 remain over the portions of electrically conductive layer 90 that are over the end portions 24A, 26A, and 28A of resistor elements 24, 26, and 28, respectively. Although the masking element 94 over the portion of electrically conductive material 90 in opening 70 and the masking element 94 over the portions of electrically conductive material 90 in openings 74 and 78 are shown as extending beyond the sidewalls of opening 70 and beyond a sidewall of opening 74 and beyond a sidewall of opening 78, this is not a limitation of the present invention. For example, the masking structure 94 over opening 70 may be in alignment with the sidewalls of opening 70 and the masking structure 94 over openings 74 and 78 may have a sidewall in alignment with a sidewall of opening 74 and a sidewall in alignment with a sidewall of opening 78.

Figure 25:
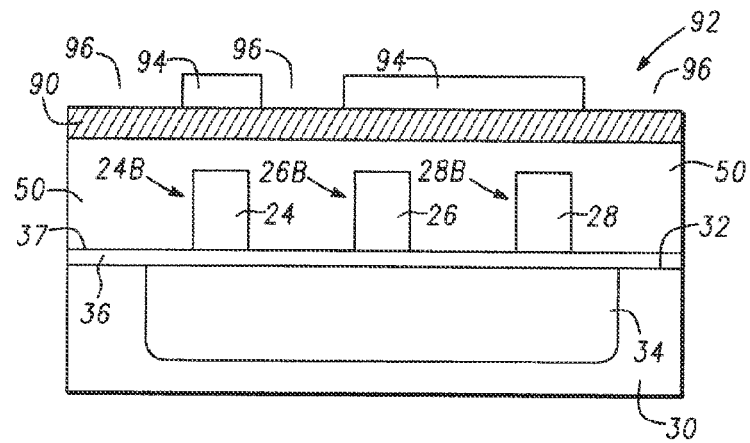
FIG. 25 is a cross-sectional view of the semiconductor component of FIG. 20 taken along the region identified by section line 25-25 of FIG. 20 but at a later stage of manufacture.

FIG. 25 is a cross-sectional view of resistor elements 24, 26, and 28 taken in the region of section line 25-25 of FIG. 20, but at a later stage of manufacture from that shown in FIG. 20. What is shown in FIG. 25 is electrically conductive layer 90 formed on dielectric layer 50 and over the body portions or center portions of resistor elements 24, 26, and 28. Masking structures 94 remain over the body portions 24B, 26B, and 28B of resistor elements 24, 26, and 28, respectively.

Figure 26:
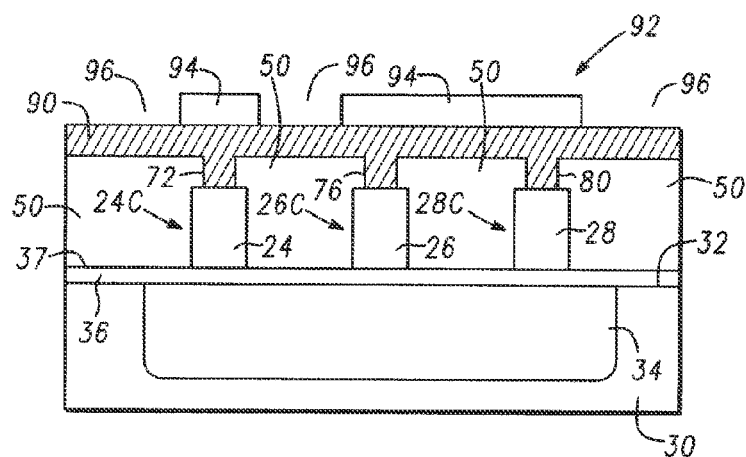
FIG. 26 is a cross-sectional view of the semiconductor component of FIG. 20 taken along the region identified by section line 26-26 of FIG. 20 but at a later stage of manufacture.

FIG. 26 is a cross-sectional view of resistor elements 24, 26, and 28 taken in the region of section line 26-26 of FIG. 20, but at a later stage of manufacture from that shown in FIG. 20. What is shown in FIG. 26 is electrically conductive layer 90 formed on dielectric layer 50 and on the portions of resistor elements 24, 26, and 28 exposed by openings 72, 76, and 80, respectively. As discussed above, the material of electrically conductive layer 90 fills openings 72, 76, and 80. Masking structures 94 remain over the portions of electrically conductive layer 90 that are over the end portions 24C, 26C, and 28C of resistor elements 24, 26, and 28, respectively. Although the masking element 94 over the portion of electrically conductive material 90 in opening 80 and the masking element 94 over the portions of electrically conductive material 90 in openings 72 and 76 are shown as extending beyond the sidewalls of opening 80 and beyond a sidewall of opening 72 and beyond a sidewall of opening 76, this is not a limitation of the present invention. For example, the masking structure 94 over opening 80 may be in alignment with the sidewalls of opening 80 and the masking structure 94 over openings 72 and 76 may have a sidewall in alignment with a sidewall of opening 72 and a sidewall in alignment with a sidewall of opening 76.

Figure 27:
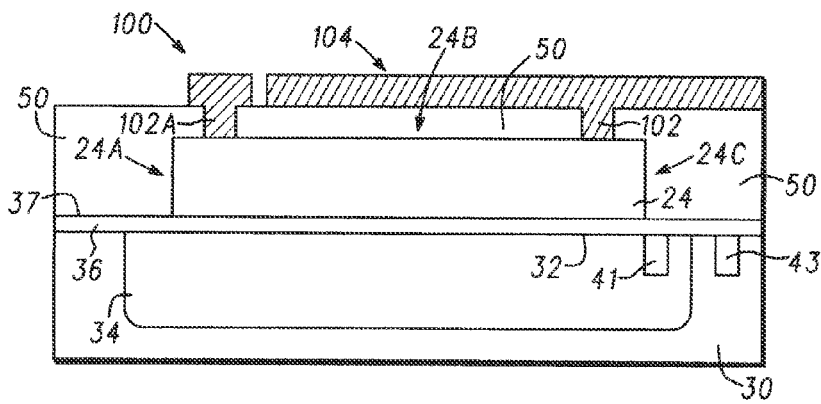
FIG. 27 is a cross-sectional view of the semiconductor component of FIG. 20 taken along the region identified by section line 21-21 of FIG. 20 but at a later stage of manufacture.

Referring now to FIGS. 27-32, the portions of electrically conductive layer 90 that are unprotected by masking elements 94 are removed using, for example, a reactive ion etch, to form electrically conductive traces. After formation of the electrically conductive traces, masking elements 94 are removed. More particularly, FIG. 27 is a cross-sectional view taken along the region of section line 21-21 of FIG. 20 but at a later stage of manufacture and illustrates the formation of an electrical conductor 100 having an electrical contact 102A at end 24A of resistor element 24 that electrically connects end 24A of resistor element to end 26A of resistor element 26. In addition, an electrical contact 102 is formed to contact end 24C of resistor element 24 and a shielding structure 104 is formed over body region 24B, i.e., the portion 24B of resistor element 24 between ends 24A and 24C.

Figure 28:
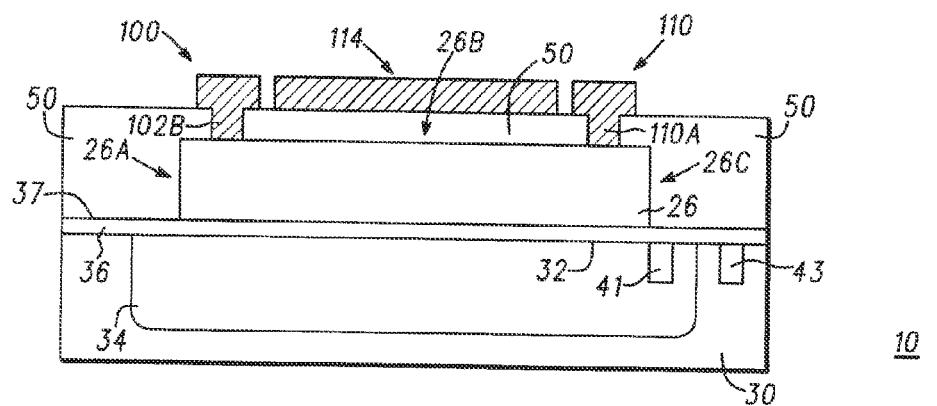
FIG. 28 is a cross-sectional view of the semiconductor component of FIG. 20 taken along the region identified by section line 22-22 of FIG. 20 but at a later stage of manufacture.

FIG. 28 is a cross-sectional view taken along section line 22-22 of FIG. 20 but at a later stage of manufacture and illustrates the formation of electrical interconnect 100 that includes an electrical contact 102B in contact with end 26A of resistor element 26. In addition, FIG. 28 illustrates the formation of an electrical interconnect 110 that includes an electrical contact 110A in contact with end 26C of resistor element 26 and the formation of a shielding structure 114 over body region 26B, i.e., the portion 26B of resistor element 26 between ends 26A and 26C.

Figure 29:
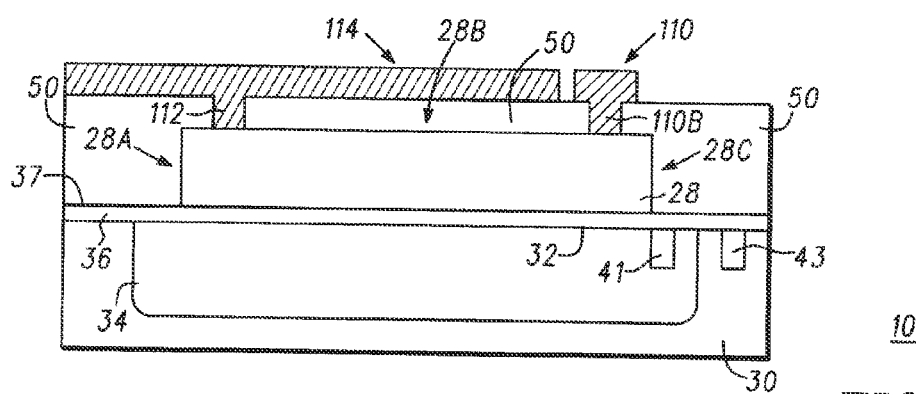
FIG. 29 is a cross-sectional view of the semiconductor component of FIG. 20 taken along the region identified by section line 23-23 of FIG. 20 but at a later stage of manufacture.

FIG. 29 is a cross-sectional view taken along the region of section line 23-23 of FIG. 20 but at a later stage of manufacture and illustrates the formation of an electrical conductor 110 having an electrical contact 110B at end 28C of resistor element 28 that electrically connects end 28C of resistor element 28 to end 26C of resistor element 26. In addition, an electrical contact 112 is formed to contact end 28A of resistor element 28 and shielding structure 114 is formed over body region 28B, i.e., the portion 28B of resistor element 28 between ends 28A and 28C.

Figure 30:
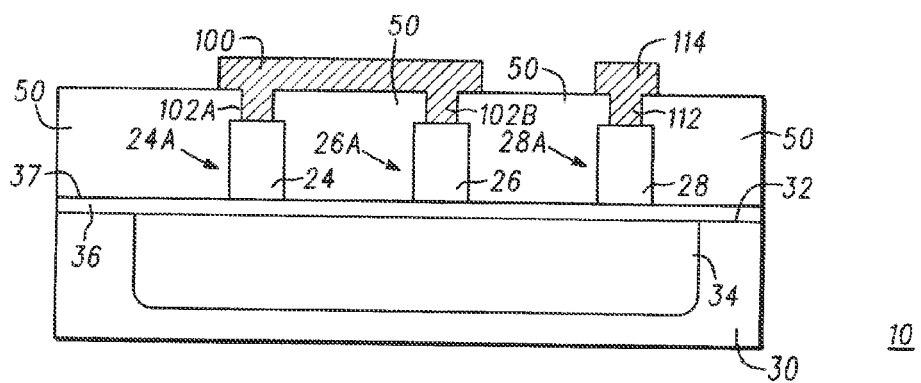
FIG. 30 is a cross-sectional view of the semiconductor component of FIG. 20 taken along the region identified by section line 24-24 of FIG. 20 but at a later stage of manufacture.

FIG. 30 is a cross-sectional view taken along section line 24-24 of FIG. 20 but at a later stage of manufacture and illustrates the formation of electrical conductor 100, electrical contacts 102A and 102B in contact with ends 24A and 26A of resistor elements 24 and 26, respectively, and electrical contact 112 in contact with end 28A of resistor element 28.

FIG. 31 is a cross-sectional view taken along section line 25-25 of FIG. 20 but at a later stage of manufacture and illustrates shielding structure 114 over body region 26B of resistor element 26 and body region 28B of resistor element 28.

FIG. 32 is a cross-sectional view taken along section line 26-26 of FIG. 20 but at a later stage of manufacture and the formation of electrical conductor 110, electrical contacts 110A and 110B in contact with ends 26C and 28C of resistor elements 26 and 28, respectively, and electrical contact 102 in contact with end 24C of resistor element 24. Shielding structure 114 is electrically isolated from electrical conductor 110 and shielding structure 104 is electrically isolated from electrical conductor 100. Although three resistor elements are shown, it should be appreciated that semiconductor component 10 may be comprised of fewer than three resistor elements. For example, semiconductor component 170 may be comprised of one semiconductor element, two semiconductor elements, three semiconductor elements, or more than three semiconductor elements.

FIG. 33 is a top view of a semiconductor component 150 in accordance with another embodiment of the present invention. By way of example, semiconductor component 150 is a polysilicon resistor. What is shown in FIG. 33 is a plurality of resistor elements 152, 154, 156, 158, 160, and 162 formed on or over a semiconductor material such as, for example, semiconductor material 12 that is shown in FIG. 2. By way of example, resistor elements 152, 154, 156, 158, 160, and 162 may be formed on a dielectric material such as, for example, dielectric material 36 and using a process similar to that described with reference to the formation of resistor elements 24, 26, and 28. Resistor element 152 has ends 152A and 152C separated by a central portion 152B. Likewise, resistor element 154 has ends 154A and 154C separated by a central portion 154B; resistor element 156 has ends 156A and 156C separated by a central portion 156B; resistor element 158 has ends 158A and 158C separated by a central portion 158B; resistor element 160 has ends 160A and 160C separated by a central portion 160B; and resistor element 162 has ends 162A and 162C separated by a central portion 162B. It should be noted that a resistor element may be referred to as a resistor finger, a semiconductor finger, a resistor layer, a resistor stripe, a resistive element, or the like, and a central portion may be referred to as a central region, a body region, a resistor body, or the like. In addition, the resistor elements can be configured such that a single resistor element forms a resistor or a plurality of resistor elements may be connected to form a resistor. In FIG. 33 resistor elements 152-162 are shown as being rectangular segments having the same lengths and widths and configured so that resistor elements 152, 156, and 160 are substantially parallel to each other, resistor elements 154, 158, and 162 are substantially parallel to each other, resistor elements 152 and 154 are substantially perpendicular to each other, resistor elements 154 and 156 are substantially perpendicular to each other, resistor elements 156 and 158 are substantially perpendicular to each other, resistor elements 158 and 160 are substantially parallel to each other, and resistor elements 160 and 162 are substantially perpendicular to each other. Thus, resistor elements 152-162 form a sawtooth pattern. A metal layer 164 is formed over resistor body regions 152A, 152B, 152C, 152D, and 152E and serves as a shielding structure. A contact 163 is formed to contact an end 152A of resistor 150 and a contact is formed to contact 169 an end 162C of resistor 150. A metal layer 166 is formed over resistor body region 162B that extends to end 162C to form another shielding structure that is electrically connected to or, alternatively, forms contact 169. It should be noted that a contact $165_1$ contacts ends 152C and 154A of resistor elements 152 and 154, respectively; a contact $165_2$ contacts ends 156C and 158A of resistor elements 156 and 158, respectively; a contact $165_3$ contacts ends 160C and 162A of resistor elements 160 and 162, respectively; a contact $167_1$ contacts ends 154C and 156A of resistor elements 154 and 156, respectively; and a contact $167_2$ contacts ends 158C and 160A of resistor elements 158 and 160, respectively. The resistor elements may be configured such that a single resistor element forms a resistor or a plurality of resistor elements may be connected to form a resistor.

Figure 34:
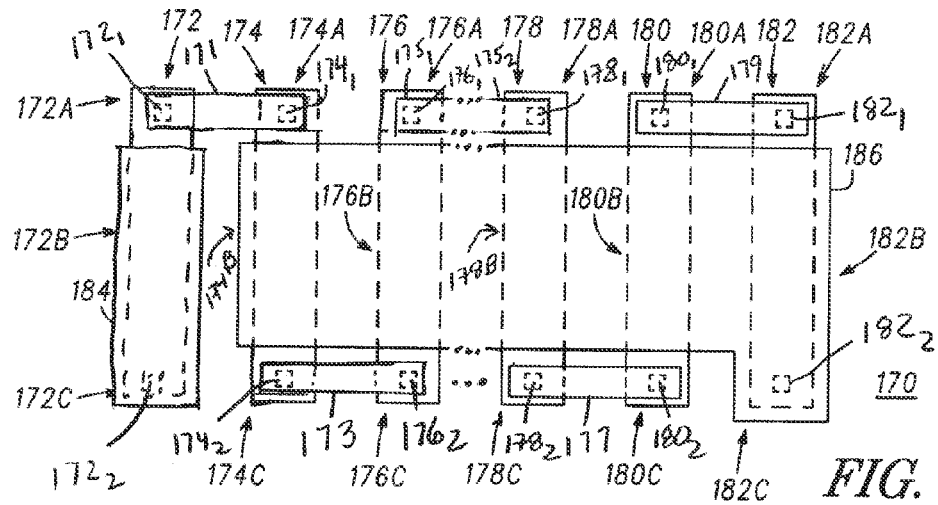
FIG. 34 is a top view of a semiconductor component in accordance with an embodiment of the present invention.

FIG. 34 is a top view of a semiconductor component 170 in accordance with an embodiment of the present invention. By way of example, semiconductor component 170 is a polysilicon resistor. What is shown in FIG. 34 is a plurality of resistor elements 172, 174, 176, 178, 180, and 182 formed on or over dielectric material 36 that is over semiconductor material 12 that is shown in FIG. 2. In accordance with an embodiment, resistor elements 172-182 are formed on a dielectric material 20 which is formed on a semiconductor material 12. Resistor element 172 has ends 172A and 172C separated by a central portion 172B. Likewise, resistor element 174 has ends 174A and 174C separated by a central portion 174B; resistor element 176 has ends 176A and 176C separated by a central portion 176B; resistor element 178 has ends 178A and 178C separated by a central portion 178B; resistor element 180 has ends 180A and 180C separated by a central portion 180B; and resistor element 182 has ends 182A and 182C separated by a central portion 182B.

A shielding structure 184 is formed over central portion 172B of resistor element 172 and a shielding structure 186 is formed over central portions 174B, 176B, . . . , 178B, 180B, 182B-182B of resistor elements 172-182. A contact $172_2$ is formed at end 172C of resistor element 172. A contact $172_1$ at end 172A of resistor element 172 is connected to a contact $174_1$ at end 174A of resistor element 174 by an electrically conductive material 171; a contact $174_2$ at end 174C of resistor element 174 is connected to a contact $176_2$ at end 176C of resistor element 176 by an electrically conductive material 173; a contact $178_2$ at end 178C of resistor element 178 is connected to a contact $180_2$ at end 180C of resistor element 180 by an electrically conductive material 177; a contact $180_1$ at end 180A of resistor element 180 is connected to a contact $182_1$ at end 182A of contact 182 by an electrically conductive material 179. A contact $182_2$ is formed at end 182C of resistor element 182. It should be noted that ellipsis are shown between resistor elements 176 and 178 to indicate that zero or more resistor elements may be formed between resistor elements 176 and 178 of semiconductor component 170. Thus, a contact at end 176A of resistor element 176 is connected to an electrically conductive material $175_1$ and a contact at end 178A of resistor element 178 is connected to an electrically conductive material $175_2$. In accordance with an embodiment in which there are no resistor elements between resistor elements 176 and 178, electrically conductive material $175_1$ and $175_2$ form a continuous electrically conductive material such as, for example, electrically conductive material 171, 173, 177, and 179. Thus, the contact at end 176A of resistor element 176 is connected to a contact at end 178A of resistor element 178 by a continuous strip of electrically conductive material formed by electrically conductive material $175_1$ and $175_2$. Although six resistor elements are shown, it should be appreciated that semiconductor component 170 may be comprised of fewer than six resistor elements. For example, semiconductor component 170 may be comprised of one semiconductor element, two semiconductor elements, three semiconductor elements, four semiconductor elements, five semiconductor elements, or more than five semiconductor elements.

Figure 35:
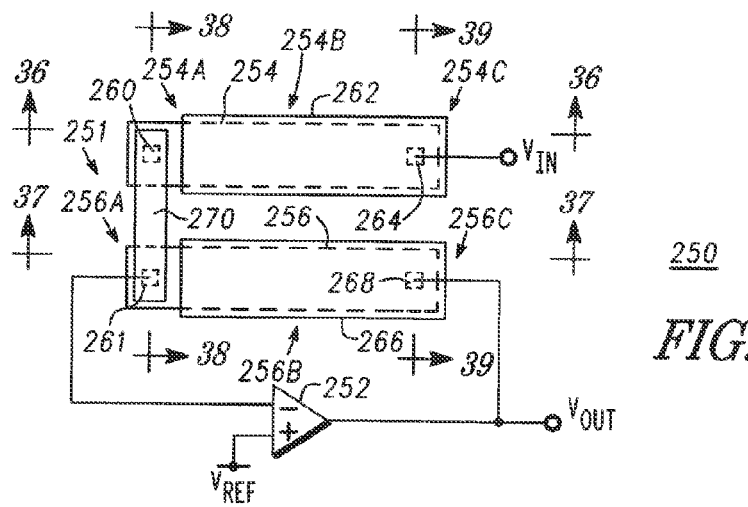
FIG. 35 is a circuit diagram of resistor elements connected to an active device such as an operational amplifier in accordance with an embodiment of the present invention.

FIG. 35 is a circuit diagram of an amplifier circuit 250 in a negative feedback configuration that includes a resistor network 251 comprising resistor elements 254A and 254B connected to an operational amplifier 252 in accordance with an embodiment of the present invention. More particularly, amplifier circuit 250 includes an operational amplifier 252 having an inverting input, a non-inverting input, and an output at which an output voltage $V_{OUT}$ may appear. A resistor element such as, for example, resistor element 254 is connected to the inverting input of operational amplifier 252 and a resistor element 256 is connected between the inverting input of operational amplifier 252 and the output of operational amplifier 252. Resistor elements 254 and 256 may be manufactured using a similar technique as that used to manufacture resistor elements 24 and 26 described with reference to FIGS. 1-32. Resistor element 254 has a contact 264 coupled for receiving an input voltage $V_{IN}$ and a contact 260 commonly connected to an electrode or contact 261 of resistor element 256 and to the inverting input of operational amplifier 252. In addition, resistor element 256 has an electrode or contact 268 connected to the output of operational amplifier 252.

Figure 36:
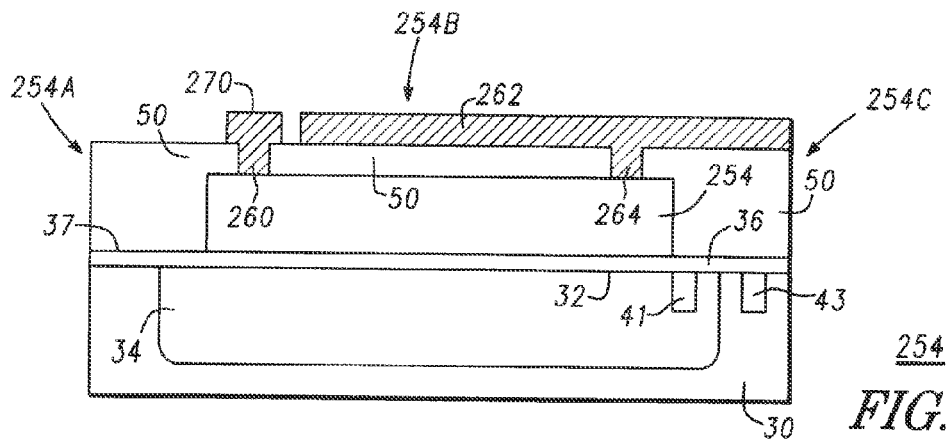
FIG. 36 is a cross-sectional view of the resistor elements of FIG. 35 taken along the region of section line 36-36 of FIG. 35.
Figure 37:
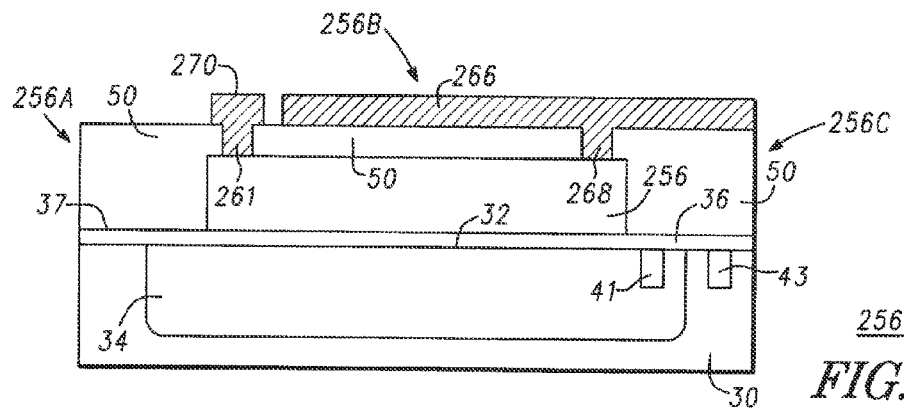
FIG. 37 is a cross-sectional view of the resistor elements of FIG. 35 taken along the region of section line 37-37 of FIG. 35.

In accordance with the embodiment of FIG. 35, resistor element 254 and resistor element 256 serve as resistors wherein resistor element 254 is comprised of a polysilicon finger formed over a semiconductor material 30 but electrically separated from semiconductor material 30 by a dielectric material 36. For the sake of completeness, FIGS. 36-39 are included to further illustrate resistor elements 254 and 256 and their formation. FIG. 36 is a cross-sectional view of resistor element 254 taken along section line 36-36 of FIG. 35. What is shown in FIG. 36 is resistor element 254 formed on dielectric layer 36. Resistor element 254 has an end 254A to which a contact or electrode 260 is connected, an end 254C to which a contact or electrode 264 is connected, and a central region or body region 254C. An electrically conductive material 266 is connected to electrode 264 and extends over a body region 254B of resistor element 254. An electrically conductive material 270 is connected to or extends from electrode 260 and electrically connects a terminal of resistor element 254 to a resistor element 256. FIG. 37 illustrates a resistor element 256 formed on dielectric layer 36. Resistor element 256 may be referred to as a polysilicon finger and has an end 256A to which electrode 261 is connected, an end 256C to which an electrode 268 is connected, and a body region 256B. An electrically conductive material 266 is connected to electrode 268 and extends over a body region 256B of resistor element 256.

Figure 38:
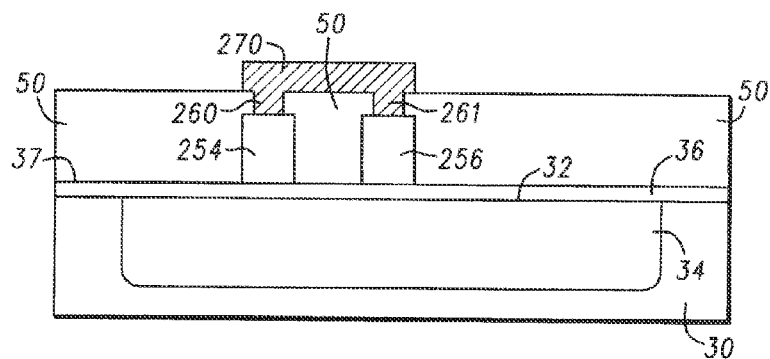
FIG. 38 is a cross-sectional view of the resistor elements of FIG. 35 taken along the region of section line 38-38 of FIG. 35.
Figure 39:
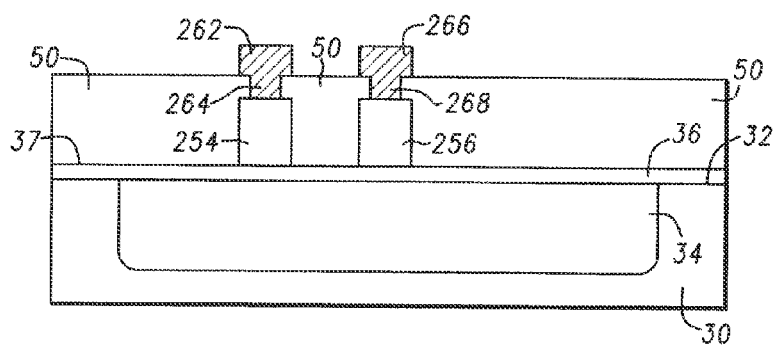
FIG. 39 is a cross-sectional view of the resistor elements of FIG. 35 taken along the region of section line 39-39 of FIG. 35.

FIG. 38 is a cross-sectional view taken along section line 38-38 of FIG. 35 further illustrating that electrodes 260 and 261 are connected to each other via an electrically conductive material 270. FIG. 39 is a cross-sectional view taken along section line 39-39 of FIG. 35 further illustrating electrodes or contacts 264 and 268 of resistor elements 254 and 256, respectively.

FIG. 40 is a circuit diagram of an amplifier circuit 300 in a negative feedback configuration in accordance with another embodiment of the present invention. More particularly, amplifier circuit 300 includes an operational amplifier 302 having an inverting input, a non-inverting input, and an output at which an output voltage $V_{OUT}$ may appear. A semiconductor component such as, for example, semiconductor component 10 comprising resistor elements 24, 26, and 28 described with reference to FIGS. 1-32 is connected to operational amplifier 302. More particularly, electrical contact 102 of resistor element 24 is coupled for receiving an input voltage $V_{IN}$ and electrical contact 102A of resistor element 24 is connected to electrical contact 102B or resistor element 26 through electrically conductive material 100. Electrical contact 110A of resistor element 26 is connected to electrical contact 110B of resistor element 28 through electrically conductive material 110 and electrical contact 112 is connected to an output of operational amplifier 302. Shielding layer 114 is formed over body regions 26B and 28B of resistor elements 26 and 28, respectively and shielding layer 104 is formed over body region 24B of resistor element 24. Thus, input voltage $V_{IN}$ is connected to the inverting input of operational amplifier 302 through resistor element 24 and the inverting input of operational amplifier 302 is connected to the output of operational amplifier 302 through series connected resistor elements 26 and 28.

FIG. 41 is a circuit diagram of an amplifier circuit 350 in a negative feedback configuration in accordance with another embodiment of the present invention. More particularly, amplifier circuit 350 includes operational amplifier 302 having an inverting input, a non-inverting input, and an output at which an output voltage $V_{OUT}$ may appear. A semiconductor component such as, for example, resistor network 251 comprising resistor elements 254 and 256 described with reference to FIGS. 35-39 is connected to operational amplifier 302. More particularly, electrical contact 264 of resistor element 254 is coupled for receiving an input voltage $V_{IN}$ and electrical contact 260 of resistor element 254 is connected to electrical contact 261 or resistor element 256 through electrically conductive material 270. Electrical contacts 260 and 261 are connected to the inverting input of operational amplifier 302. Shielding layer 262 is formed over body region 254B. Electrical contact 268 of resistor element 256 is connected to the output of operational amplifier 302. Amplifier circuit 350 further includes a resistor network 251A connected to operational amplifier 302. It should be noted that resistor network 251A is the same as resistor network 251, however reference character A has been appended to reference character 251 to distinguish between the two resistor networks. In addition, reference character A has been appended to reference characters 260, 261, 262, 264, 266, 268, and 270, reference character $A_1$ has been appended to reference characters 254 and 256 to distinguish between the elements of resistor networks 251 and 251A. Electrical contact 264A of resistor element 254$A_1$ is coupled for receiving an input voltage $V_{IN}$ and electrical contact 260A of resistor element 254$A_1$ is connected to electrical contact 261A of resistor element 256$A_1$ through electrically conductive material 270A. Electrical contacts 260A and 261A are connected to the noninverting input of operational amplifier 302. Electrical contact 268A of resistor element 256$A_1$ is coupled for receiving a reference voltage $V_{REF}$.

FIG. 42 is a circuit diagram of an amplifier circuit 400 in a negative feedback configuration in accordance with another embodiment of the present invention. More particularly, amplifier circuit 400 includes an operational amplifier 302 having an inverting input, a non-inverting input, and an output at which an output voltage $V_{OUT}$ may appear. A semiconductor component such as, for example, semiconductor component 10 comprising resistor elements 24, 26, and 28 described with reference to FIGS. 1-32 is connected to operational amplifier 302. More particularly, electrical contact 102 of resistor element 24 is coupled for receiving a reference voltage $V_{REF}$ and electrical contact 102A of resistor element 24 is connected to electrical contact 102B or resistor element 26 through electrically conductive material 100. Electrical contacts 102A and 102B and electrically conductive material 110 are electrically connected to the inverting input of operational amplifier 302. Electrical contact 110A of resistor element 26 is connected to electrical contact 110B of resistor element 28 through electrically conductive material 110 and electrical contact 112 is connected to an output of operational amplifier 302. Shielding layer 114 is formed over body regions 26B and 28B of resistor elements 26 and 28, respectively and shielding layer 104 is formed over body region 24B of resistor element 24. Thus, input voltage $V_{IN}$ is connected to the noninverting input of operational amplifier 302 and reference voltage $V_{REF}$ is connected to the inverting input of operational amplifier 302 through resistor element 24. In addition, the noninverting input of operational amplifier 302 is connected to the output of operational amplifier 302 through series connected resistor elements 26 and 28.

Figure 43:
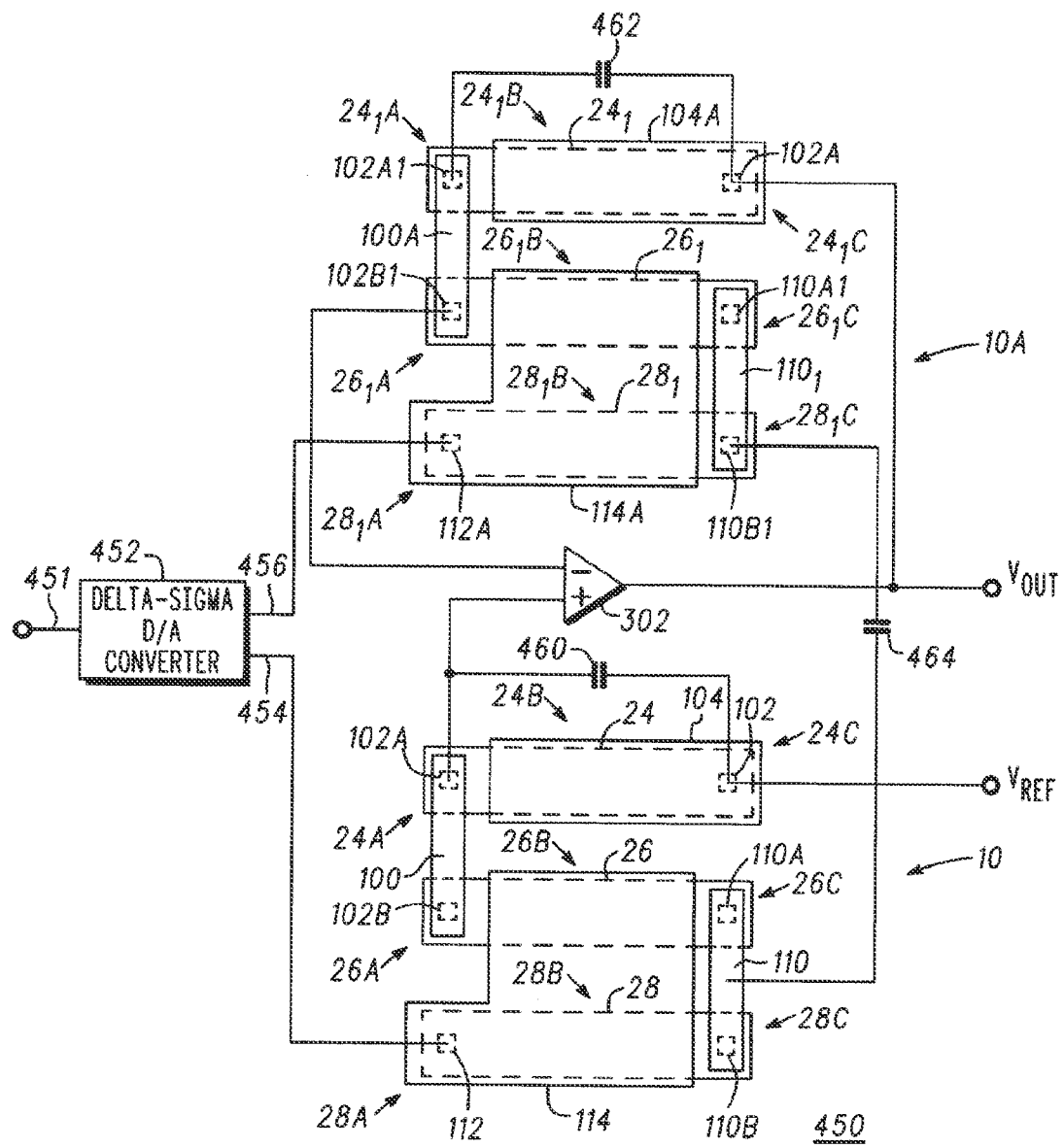
FIG. 43 is a circuit diagram of a filter in accordance with another embodiment of the present invention.

FIG. 43 is a circuit diagram of a second order filter 450 in accordance with another embodiment of the present invention. Second order filter 450 includes an operational amplifier 302 having an inverting input, a non-inverting input, and an output at which an output voltage $V_{OUT}$ may appear. A semiconductor component such as, for example, semiconductor component 10 comprising resistor elements 24, 26, and 28 described with reference to FIGS. 1-32 is connected to the noninverting input of operational amplifier 302 and to an output 454 of a delta-sigma digital-to-analog converter 452 and a semiconductor component 10A comprising resistor elements 24A, 26A, and 28A are connected to the inverting input of operational amplifier 302 and to an output 456 of delta-sigma digital-to-analog converter 452. Delta-sigma digital-to-analog converter 452 has an input 451. It should be noted that two semiconductor components are coupled to operational amplifier 302, wherein the two semiconductor components are the same. Thus, reference character A has been appended to reference characters 10, 100, 102, 112, and 114 to distinguish the elements from each other. In addition, subscripted reference character$_1$ has been appended to reference characters 24, 26, and 28 to distinguish the elements from each other, and a reference character 1 has been appended to reference characters 102A, 102B, 110A, and 110B to distinguish the elements from each other. Thus, resistor element $24_1$ has ends $24_1A$ and $24_1C$ connected by a body region $24_1B$; resistor element $26_1$ has ends $26_1A$ and $26_1C$ connected by a body region $26_1B$; and resistor element $28_1$ has ends $28_1A$ and $28_1C$ connected by a body region $28_1B$.

Electrical contact 102 of resistor element 24 is coupled for receiving a reference voltage $V_{REF}$ and electrical contact 102A of resistor element 24 is connected to electrical contact 102B or resistor element 26 through electrically conductive material 100. Electrical contacts 102A and 102B are electrically connected to the noninverting input of operational amplifier 302. Electrical contact 110A of resistor element 26 is connected to electrical contact 110B of resistor element 28 through electrically conductive material 110 and electrical contact 112 is connected to output 454 of delta-sigma digital-to-analog converter 452. Shielding layer 114 is formed over body regions 26B and 28B of resistor elements 26 and 28, respectively and shielding layer 104 is formed over body region 24B of resistor element 24. Thus, output 454 is connected to the noninverting input of operational amplifier 302 through series connected resistor elements 26 and 28 and reference voltage $V_{REF}$ is connected to the noninverting input of operational amplifier 302 through resistor element 24.

Electrical contact 102A of resistor element $24_1$ is connected to the output of operational amplifier 302 and electrical contact 102A1 of resistor element $24_1$ is connected to electrical contact 102B1 or resistor element $26_1$ through electrically conductive material 100A. Electrical contacts 102A1 and 102B1 are electrically connected to the inverting input of operational amplifier 302. Electrical contact 110A1 of resistor element $26_1$ is connected to electrical contact 110B1 of resistor element $28_1$ through electrically conductive material $110_1$ and electrical contact 112A is connected to output 456 of delta-sigma digital-to-analog converter 452. Shielding layer 114A is formed over body regions $26_1B$ and $28_1B$ of resistor elements $26_1$ and $28_1$, respectively and shielding layer 104A is formed over body region $24_1B$ of resistor element 24A. Thus, output 454 is connected to the output of operational amplifier 302 through series connected resistor elements $28_1$, $26_1$ and $24_1$.

A capacitor 460 is connected from contact 102 of resistor element 24 to the noninverting input of operational amplifier 302, a capacitor 462 is connected from the inverting input of operational amplifier 302 to the output of operational amplifier 302 through electrically conductive material 110A. It should be noted that resistor 462 is connected in parallel with resistor element $24_1$. A capacitor 464 is connected from contact 110 to contact $110_1$. It should be noted that contacts 110A1 and 110B1 and electrically conductive material $110_1$ are connected to one terminal of capacitor 464 and contacts 110A and 110B and electrically conductive material 110 are connected to the other terminal of capacitor 464.

Figure 44:
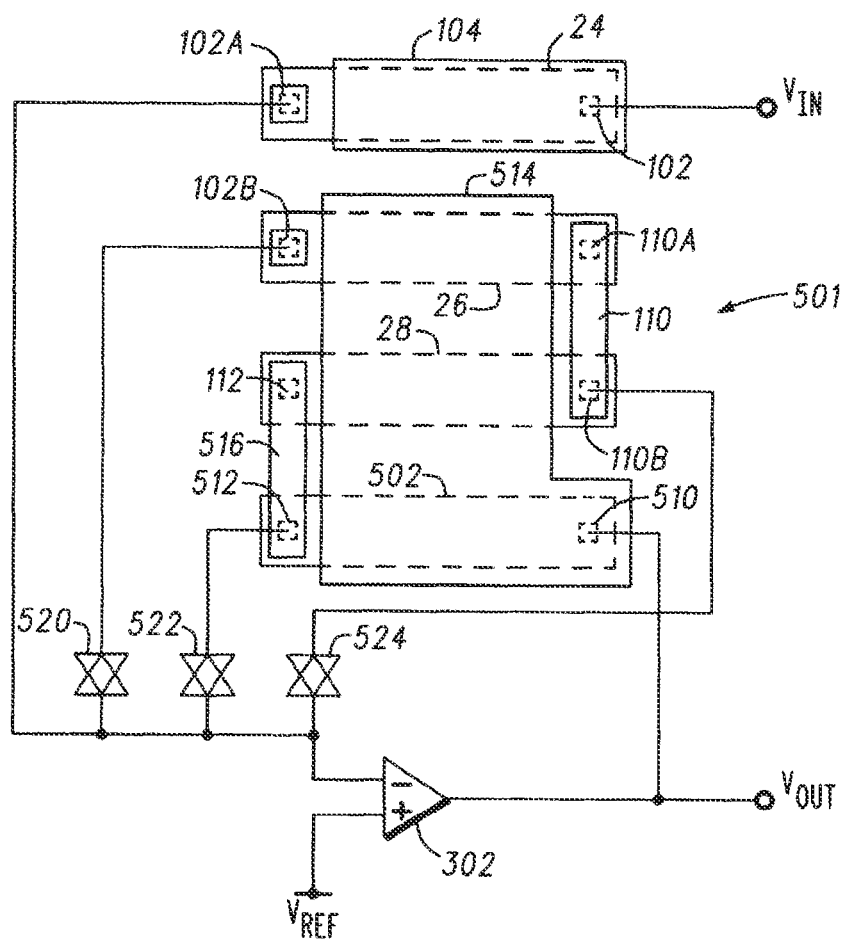
FIG. 44 is a circuit diagram of a programmable gain amplifier in accordance with another embodiment of the present invention.

FIG. 44 is a circuit diagram of a programmable gain amplifier 500 in accordance with another embodiment of the present invention. More particularly, programmable gain amplifier 500 includes an operational amplifier 302 having an inverting input, a non-inverting input, and an output at which an output voltage $V_{OUT}$ may appear. The noninverting input of operational amplifier 302 is coupled for receiving a reference voltage $V_{REF}$. Programmable gain amplifier 500 includes a plurality of resistor elements and a plurality of transfer gates connected to operational amplifier 302. The plurality of resistor elements includes a resistor element such as for example resistor element 24 having an electrical contact 102 and an electrical contact 102A at the ends of resistor element 24. Electrical contact 102 is coupled for receiving an input voltage $V_{IN}$ and electrical contact 102A is connected to the inverting input of operational amplifier 302. It should be noted that electrical contact 102A is not directly connected to electrical contact 102B. A semiconductor component 501 similar to, for example, semiconductor component 10 is connected to the inverting input of operational amplifier 302 through a plurality of transfer gates 520, 522, and 524. Semiconductor component 501 includes a resistor element 26 having electrical contacts 102B and 110A and a resistor element 28 having electrical contacts 110B and 112. Contacts 110A and 110B are electrically connected through electrical interconnect 110. Semiconductor component 501 further includes a resistor element 502 having contacts 510 and 512, which contact 512 is electrically connected to contact 112 through an electrical interconnect 516. An electrical shielding structure 104 is formed over resistor element 24 and an electrical shielding structure 514 is formed over resistor elements 26, 28, and 502. Electrical shielding structure 114 is electrically isolated from resistor element 24 and electrical shielding structure 514 is electrically isolated from resistor elements 26, 28, and 502. Techniques for manufacturing semiconductor component 501 may be similar to those used for manufacturing semiconductor component 10.

Electrical contact 102 of resistor element 24 is coupled for receiving an input voltage $V_{IN}$ and electrical contact 102A of resistor element 24 is connected to the inverting input of operational amplifier 302. A terminal of transfer gate 520 is connected to contact 102B and the other terminal of transfer gate 520 is connected to the inverting input of operational amplifier 302; a terminal of transfer gate 522 is connected to contacts 112 and 512 and the other terminal of transfer gate 522 is connected to the inverting input of operational amplifier 302; and a terminal of transfer gate 524 is connected to contacts 110A and 110B and the other terminal of transfer gate 524 is connected to the inverting input of operational amplifier 302. Electrical contact 510 is electrically connected to the output of operational amplifier 302.

Figure 45:
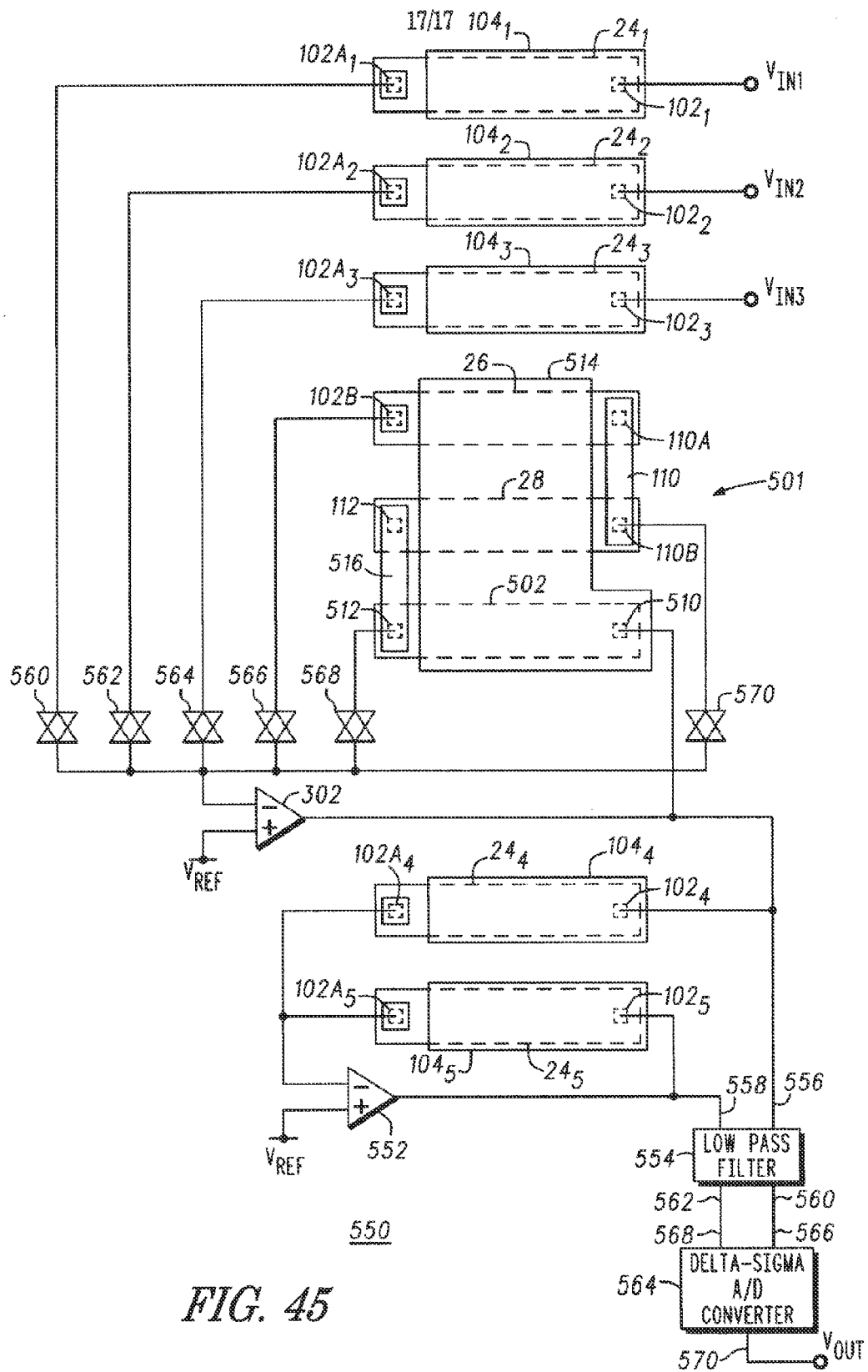
FIG. 45 is a circuit diagram of a digital signal processor in accordance with another embodiment of the present invention.

FIG. 45 is a circuit diagram of a digital signal processor 550 in accordance with another embodiment of the present invention. More particularly, programmable gain amplifier 550 includes an operational amplifier 302 having an inverting input, a non-inverting input, and an output at which an output voltage $V_{OUT}$ may appear. The noninverting input of operational amplifier 302 is coupled for receiving a reference voltage $V_{REF}$. Digital signal processer 550 includes a plurality of resistor elements and a plurality of transfer gates connected to operational amplifier 302. The plurality of resistor elements includes a resistor element such as for example resistor element 24 having an electrical contact 102 and an electrical contact 102A at the ends of resistor element 24. For the sake of clarity, the resistor elements have had subscripted numbers 1, 2, 3, 4, and 5 attached to the reference characters to distinguish between resistor elements. Thus, resistor element $24_1$ has an electrical contact $102_1$ and an electrical contact $102A_1$ at the ends of resistor element $24_1$; resistor element $24_2$ has an electrical contact $102_2$ and an electrical contact $102A_2$ at the ends of resistor element $24_2$; resistor element $24_3$ has an electrical contact $102_3$ and an electrical contact $102A_3$ at the ends of resistor element $24_3$; resistor element $24_4$ has an electrical contact $102_4$ and an electrical contact $102A_4$ at the ends of resistor element $24_4$; and resistor element $24_5$ has an electrical contact $102_5$ and an electrical contact $102A_5$ at the ends of resistor element $24_5$. Electrical contact $102_1$ is coupled for receiving an input voltage $V_{IN1}$ and electrical contact $102A_1$ is connected to a terminal of a transfer gate 560. The other terminal of transfer gate 560 is connected to the inverting input of operational amplifier 302. Electrical contact $102_2$ is coupled for receiving an input voltage $V_{IN2}$ and electrical contact $102A_2$ is connected to a terminal of a transfer gate 562. The other terminal of transfer gate 562 is connected to the inverting input of operational amplifier 302. Electrical contact $102_3$ is coupled for receiving an input voltage $V_{IN3}$ and electrical contact $102A_3$ is connected to a terminal of a transfer gate 564. The other terminal of transfer gate 564 is connected to the inverting input of operational amplifier 302. An electrical shielding structure $104_1$ is formed over resistor element $24_1$; an electrical shielding structure $104_2$ is formed over resistor element $24_2$; and an electrical shielding structure $104_3$ is formed over resistor element $24_3$.

A semiconductor component 501 similar to, for example, semiconductor component 10 is connected to the inverting input of operational amplifier 302 through a plurality of transfer gates 520, 522, and 524. Semiconductor component 501 includes a resistor element 26 having electrical contacts 102B and 110A and a resistor element 28 having electrical contacts 110B and 112. Contacts 110A and 110B are electrically connected through electrical interconnect 110. Semiconductor component 501 further includes a resistor element 502 having contacts 510 and 512, which contact 512 is electrically connected to contact 112 through an electrical interconnect 516. An electrical shielding structure 514 is formed over resistor elements 26, 28, and 502. Electrical shielding structures $114_1$, $114_2$, and $114_3$ are electrically isolated from resistors element $24_1$, $24_2$, and $24_3$, and electrical shielding structure 514 is electrically isolated from resistor elements 26, 28, and 502. Techniques for manufacturing semiconductor component 501 may be similar to those used for manufacturing semiconductor component 10.

Electrical contact 510 is connected to the output of operational amplifier 302, to electrical contact 102A$_4$ of resistor element 24$_4$, and to an input 556 of low pass filter 554. Electrical contact 102$_4$ of resistor element 104$_4$ is electrically connected to the inverting input of an operational amplifier 552 and to electrical contact 102A$_5$. Electrical contact 102$_5$ is electrically connected to the output of operational amplifier 552 and to an input 558 of low pass filter 554. A delta-sigma analog-to-digital converter (ADC) 564 has inputs 566 and 568 connected outputs 560 and 562, respectively, of low pass filter 554. Delta-sigma ADC 564 has an output 570.

By now it should be appreciated that a polysilicon resistor and a method suitable for use have been provided. The polysilicon resistor is manufactured over a semiconductor material that is electrically connected or tied to a fixed potential. Electrically connecting the semiconductor material to the fixed potential mitigates the influence of the semiconductor material on the resistance value of the polysilicon resistor thereby decoupling the influence of the electrical potential of the semiconductor material on the resistance value of the polysilicon resistor. Connecting the semiconductor material to the fixed potential improves the linearity of the polysilicon resistor which improves the distortion characteristics of circuits that include a polysilicon resistor. In addition, an electrically conductive layer is formed over portions of the polysilicon resistor to cancel out polysilicon resistance value changes arising from changes in the electric potential of the semiconductor material.

In accordance with an embodiment, an amplifier circuit having first and second input terminals and a output terminal may be fabricated that includes a first polysilicon resistor coupled to the first input terminal and a feedback polysilicon resistor coupled between the first input terminal and the output terminal of the amplifier. An electrically conductive material such as, for example, metal is connected to the polysilicon at an input side or end of the first polysilicon resistor and an electrically conductive material is connected to the polysilicon at the output side of the feedback polysilicon resistor. The first polysilicon resistor and the feedback polysilicon resistor are formed over a semiconductor material that is coupled to a fixed potential. Alternatively, the first polysilicon resistor and the feedback polysilicon resistor may be manufactured over a well region of a first conductivity type that is formed in a semiconductor material of a second conductivity type, wherein the well region is coupled to a first fixed potential and the semiconductor material is coupled to a second potential.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for manufacturing a semiconductor component, comprising:
   providing a body of semiconductor material of a first conductivity type;
   forming a well of a second conductivity type in a first portion of the semiconductor material;
   forming a first doped region of the second conductivity type in the well of the second conductivity type, wherein the first doped region is configured to be coupled to a first fixed potential;
   forming a second doped region of the first conductivity type in a second portion of the semiconductor material of the first conductivity type, the second doped region of the first conductivity type spaced apart from the well of the second conductivity type, wherein the second doped region is configured to be coupled to a second fixed potential;
   forming a first dielectric material over the body of semiconductor material of the first conductivity type;
   forming a plurality of semiconductor fingers over a portion of the first dielectric material that is over the well of the second conductivity type, the semiconductor fingers of the plurality of semiconductor fingers spaced apart from each other, wherein a first semiconductor finger of the plurality of semiconductor fingers has a first end spaced apart from a second end by a first central region and a second semiconductor finger of the plurality of semiconductor fingers has a first end spaced apart from a second end by a second central region, the second end of the first semiconductor finger of the plurality of semiconductor fingers coupled to the second end of the second semiconductor finger of the plurality of semiconductor fingers, the first end of the first semiconductor finger configured as first contact of a resistor and the first end of the second semiconductor finger of the plurality of semiconductor fingers configured as a second contact of the resistor, and wherein an electrical connection between the well and the plurality of semiconductor fingers is absent;
   forming a second dielectric material over the first central region of the first semiconductor finger of the plurality of semiconductor fingers;
   forming an electrically conductive material over the second dielectric material that is over the central region of the first semiconductor finger.

2. The method of claim 1, wherein forming the plurality of semiconductor fingers comprises:
   forming a layer of semiconductor material over the first dielectric material; and
   removing portions of the layer of semiconductor material to leave remaining portions of the layer of semiconductor material that serve as the plurality of semiconductor fingers.

3. The method of claim 2, wherein removing the portions of the layer of semiconductor material exposes portions of the first dielectric material.

4. The method of claim 1, wherein forming a second dielectric material over the central region of the first semiconductor finger of the plurality of semiconductor fingers includes forming the second dielectric material over the plurality of semiconductor fingers and further including removing a first portion of the second dielectric material and a second portion of the second dielectric material, the first portion of the second dielectric material over the first end of the first semiconductor finger and the second portion of the second dielectric material over the first end of the second semiconductor finger.

5. The method of claim 4, wherein forming the electrically conductive material over the second dielectric material that is over the first central region of the first semiconductor finger comprises forming a first portion of the electrically conductive material to be in contact with the first end of the first semiconductor finger.

6. The method of claim 4, wherein forming the electrically conductive material over the second dielectric material that is over the first central region of the first semiconductor finger comprises forming a first portion of the electrically conductive material to be in contact with the first end of the first semiconductor finger and wherein forming the electrically conductive material over the second dielectric material that is over the central region of the first semiconductor finger further includes forming a second portion of the electrically conductive material to be electrically coupled to the second end of the second semiconductor finger, wherein the second portion of the electrically conductive material is electrically isolated from the first portion of the electrically conductive material and further including forming the second portion of the electrically conductive material to be in contact with the first end of the second semiconductor finger.

7. The method of claim 1, wherein forming the plurality of semiconductor fingers over the first dielectric material further includes:
forming a third semiconductor finger having a first end and a second end, the third semiconductor finger having a rectangular shape, wherein the first end of the third semiconductor finger is spaced apart from the second end of the third semiconductor finger by a third central region of the third semiconductor finger, wherein the first semiconductor finger, the second semiconductor finger, and the third semiconductor finger are substantially parallel to each other.

8. The method of claim 7, wherein
forming the second dielectric material over the first central region of the first semiconductor finger of the plurality of semiconductor fingers includes forming the second dielectric material over the first ends, the second ends, and the central portions of the first semiconductor finger, the second semiconductor finger, and the third semiconductor finger;
forming openings in the second dielectric material to expose portions of the first end and the second end of the first semiconductor finger, the first end and the second end of the second semiconductor finger, and the first end and the second end of the third semiconductor finger; and wherein
forming the electrically conductive material over the dielectric material that is over the central region of the first semiconductor finger further includes forming the electrically conductive material in the openings formed at the first ends and the second ends of the first semiconductor finger, the second semiconductor finger, and the third semiconductor finger.

9. The method of claim 8, wherein forming the electrically conductive material further includes electrically coupling the first end of the first semiconductor finger with the first end of the second semiconductor finger with a first portion of the electrically conductive material and electrically coupling the second end of the second semiconductor finger with the second end of the third semiconductor finger with a second portion of the electrically conductive material.

10. The method of claim 9, wherein forming the electrically conductive material further includes:
forming a third portion of the electrically conductive material in contact with the first end of the third semiconductor finger and over the body of the third semiconductor finger, wherein the third portion of the electrically conductive material is electrically isolated from the second portion of the electrically conductive material; and
forming a fourth portion of the electrically conductive material in contact with the second end of the first semiconductor finger and over the body of the first semiconductor finger, wherein the fourth portion of the electrically conductive material is electrically isolated from the first portion of the electrically conductive material.

11. A semiconductor component, comprising:
a semiconductor material having a first major surface;
a first doped region of a second conductivity type extending from the first surface into a portion of the semiconductor material;
an enhanced doped region of the second conductivity type formed in the first doped region, wherein the enhanced doped region is configured to be coupled to a first fixed potential;
an enhanced doped region of the first conductivity type formed in the semiconductor material, the enhanced doped region of the first conductivity type spaced apart from the first doped region of the second conductivity type, wherein the enhanced doped region of the first conductivity type is configured to be coupled to a second fixed potential;
a first layer of dielectric material disposed over the first major surface;
a first layer of semiconductor material formed over a first portion of the first layer of dielectric material, the first layer of semiconductor material having a first portion, a second portion, and a third portion, the second portion between the first portion and the third portion;
a second layer of semiconductor material formed over a second portion of the first layer of dielectric material, the second layer of semiconductor material having a first portion, a second portion, and a third portion, the second portion between the first portion and the third portion;
a second layer of dielectric material over at least the second portion of the first layer of semiconductor material and over the second portion of the second layer of semiconductor material;
a first electrically conductive material over a first portion of the second layer of dielectric material, the second portion of the first layer of semiconductor material, and the first doped region of the second conductivity type, wherein the first electrically conductive material is electrically coupled to the first portion of the first layer of semiconductor material, and wherein an electrical connection between the first doped region of the second conductivity type and the first electrically conductive material over the second layer of dielectric material is absent;
a second electrically conductive material over the second layer of dielectric material, the second portion of the second layer of semiconductor material, and the first doped region of the second conductivity type, wherein the second electrically conductive material is electrically coupled to the first portion of the second layer of semiconductor material, wherein the second electrically conductive material is spaced apart from the first electrically conductive material; and
a third electrically conductive material over the third portion of the first layer of semiconductor material and the third portion of the second layer of semiconductor material, wherein the third electrically conductive material electrically couples the third portion of the first layer of semiconductor material to the third portion of the second layer of semiconductor material.

12. The semiconductor component of claim 11, wherein the first layer of semiconductor material is polysilicon doped with an impurity material.

13. The semiconductor component of claim 11, further including:
- a third layer of semiconductor material formed over a third portion of the first layer of dielectric material, the third layer of semiconductor material having a first portion, a second portion, and a third portion, the second portion between the first portion and the third portion;
- the second layer of dielectric material over at least the second portion of the third layer of semiconductor material;
- the second layer of dielectric material over at least the second portion of the third layer of semiconductor material;
- the second electrically conductive material over the second layer of dielectric material and the second portion of the third layer of semiconductor material; and
- a fourth electrically conductive material over the third portion of the third layer of semiconductor material.

14. The semiconductor component of claim 13, further including:
- a fourth layer of semiconductor material formed over a fourth portion of the first layer of dielectric material, the fourth layer of semiconductor material having a first portion, a second portion, and a third portion, the second portion between the first portion and the third portion;
- the second layer of dielectric material over the second portion of the fourth layer of semiconductor material; and
- a portion of the second electrically conductive material over the second portion of the fourth layer of semiconductor material.

15. The semiconductor component of claim 14, wherein the first layer of semiconductor material, the second layer of semiconductor material, and the third layer of semiconductor material are parallel to each other, and wherein the first portion of the third layer of semiconductor material is adjacent to the first portion of the first layer of semiconductor material and to the first portion of the second layer of semiconductor material.

16. The semiconductor component of claim 15, wherein the semiconductor material is coupled for receiving a bias voltage.

17. A semiconductor component, comprising:
- an active device having a first input, a second input, and an output; and
- a resistor network comprising:
  - a first polysilicon resistor having a first region, a second region, and a third region, the second region between the first region and the third region, wherein a least a portion of the second region of the first polysilicon resistor is between a first layer of dielectric material and a second layer of dielectric material, and wherein a first electrically conductive material is formed over the second layer of dielectric material and contacts the first region of the first polysilicon resistor, and a second electrically conductive material contacts the third region of the first polysilicon resistor; and wherein
  - the first polysilicon resistor is above a well of a first conductivity type formed in a first portion of a semiconductor material of a second conductivity type, a first doped region of the first conductivity type is formed in the well and configured to be coupled to a first fixed potential, and a second doped region of the second conductivity type is formed in a second portion of the semiconductor material and configured to be coupled to a second fixed potential, and an electrical connection between the well and the first polysilicon resistor is absent.

18. The semiconductor component of claim 17, wherein the active device is an amplifier having the first input, the second input, and the output, and wherein the first region of the first polysilicon resistor is coupled to the first input, and further including: a second polysilicon resistor having a first region, a second region, and a third region, the second region of the second polysilicon resistor between the first region of the second polysilicon resistor and the third region of the second polysilicon resistor, wherein a least a portion of the second region of the second polysilicon resistor is between a third layer of dielectric material and a fourth layer of dielectric material, and wherein a third electrically conductive material is formed over the second layer of dielectric material and contacts the first region of the second polysilicon resistor.

* * * * *